US009660105B2

(12) United States Patent
Divakaruni et al.

(10) Patent No.: US 9,660,105 B2
(45) Date of Patent: May 23, 2017

(54) FINFET CROSSPOINT FLASH MEMORY

(71) Applicant: GLOBALFOUNDRIES INC., Grand Cayman (KY)

(72) Inventors: Ramachandra Divakaruni, Ossining, NY (US); Arvind Kumar, Chappaqua, NY (US); Carl J. Radens, Lagrangeville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/089,647

(22) Filed: Apr. 4, 2016

(65) Prior Publication Data
US 2016/0218222 A1    Jul. 28, 2016

Related U.S. Application Data

(62) Division of application No. 14/102,843, filed on Dec. 11, 2013, now Pat. No. 9,305,930.

(51) Int. Cl.
*H01L 21/336* (2006.01)
*H01L 21/311* (2006.01)
(Continued)

(52) U.S. Cl.
CPC ...... *H01L 29/7887* (2013.01); *H01L 21/0223* (2013.01); *H01L 21/0234* (2013.01); *H01L 21/02238* (2013.01); *H01L 21/02252* (2013.01); *H01L 21/02255* (2013.01); *H01L 21/3086* (2013.01); *H01L 27/11521* (2013.01); *H01L 27/1211* (2013.01); *H01L 29/0649* (2013.01); *H01L 29/0653* (2013.01); *H01L 29/6681* (2013.01); *H01L 29/66545* (2013.01);
(Continued)

(58) Field of Classification Search
CPC ......... H01L 21/823431; H01L 29/7841; H01L 27/108; H01L 27/10802; H01L 27/11521; H01L 29/66825
See application file for complete search history.

(56) References Cited

U.S. PATENT DOCUMENTS 6,657,252 B2    12/2003  Fried et al.
7,087,952 B2     8/2006  Zhu et al.
(Continued)

FOREIGN PATENT DOCUMENTS

EP     2026378 A2    2/2009

*Primary Examiner* — Victor A Mandala
*Assistant Examiner* — Regan J Rundio
(74) *Attorney, Agent, or Firm* — Scully, Scott, Murphy & Presser, P.C.

(57) ABSTRACT

A flash memory device in a dual fin single floating gate configuration is provided. Semiconductor fins are formed on a stack of a back gate conductor layer and a back gate dielectric layer. Pairs of semiconductor fins are formed in an array environment such that shallow trench isolation structures can be formed along the lengthwise direction of the semiconductor fins within the array. After formation of tunneling dielectrics on the sidewalls of the semiconductor fins, a floating gate electrode is formed between each pair of proximally located semiconductor fins by deposition of a conformal conductive material layer and an isotropic etch. A control gate dielectric and a control gate electrode are formed by deposition and patterning of a dielectric layer and a conductive material layer.

18 Claims, 23 Drawing Sheets

(51) Int. Cl.
*H01L 29/788* (2006.01)
*H01L 27/11521* (2017.01)
*H01L 29/66* (2006.01)
*H01L 29/06* (2006.01)
*H01L 21/02* (2006.01)
*H01L 21/308* (2006.01)
*H01L 29/78* (2006.01)
*H01L 27/12* (2006.01)
*H01L 27/115* (2017.01)
*H01L 29/786* (2006.01)
*H01L 21/8234* (2006.01)
*H01L 21/306* (2006.01)

(52) U.S. Cl.
CPC .. *H01L 29/66795* (2013.01); *H01L 29/66825* (2013.01); *H01L 29/7855* (2013.01); *H01L 29/7881* (2013.01); *H01L 21/306* (2013.01); *H01L 21/823431* (2013.01); *H01L 29/785* (2013.01)

(56) References Cited

U.S. PATENT DOCUMENTS

| | | | | |
|---|---|---|---|---|
| 7,329,580 B2* | 2/2008 | Choi | ................ | H01L 21/84 257/E21.682 |
| 7,416,941 B2 | 8/2008 | Anderson et al. | | |
| 7,473,611 B2* | 1/2009 | Cho | ................ | H01L 21/28273 257/E21.17 |
| 7,619,276 B2 | 11/2009 | Zhu | | |
| 7,691,690 B2 | 4/2010 | Zhu et al. | | |
| 7,737,485 B2* | 6/2010 | Cho | ................ | H01L 21/28273 257/314 |
| 7,811,889 B2 | 10/2010 | Trivedi et al. | | |
| 7,879,677 B2 | 2/2011 | Lee | | |
| 8,217,435 B2 | 7/2012 | Chang et al. | | |
| 8,716,803 B2 | 5/2014 | Wang | | |
| 9,024,373 B2* | 5/2015 | Kim | ................ | H01L 29/7926 257/316 |
| 9,406,689 B2* | 8/2016 | Li | ................ | H01L 21/845 |
| 2008/0157182 A1 | 7/2008 | Song et al. | | |
| 2008/0203462 A1* | 8/2008 | Goarin | ................ | H01L 21/28273 257/316 |
| 2008/0251843 A1* | 10/2008 | Nakajima | ................ | H01L 27/108 257/347 |
| 2009/0045450 A1* | 2/2009 | Koo | ................ | H01L 27/115 257/316 |
| 2009/0108351 A1 | 4/2009 | Yang et al. | | |
| 2011/0204419 A1* | 8/2011 | Johnson | ................ | H01L 21/76895 257/204 |
| 2011/0237046 A1 | 9/2011 | Maszara et al. | | |
| 2012/0119297 A1 | 5/2012 | Schulz | | |
| 2012/0299098 A1* | 11/2012 | Liu | ................ | H01L 29/42328 257/347 |

* cited by examiner

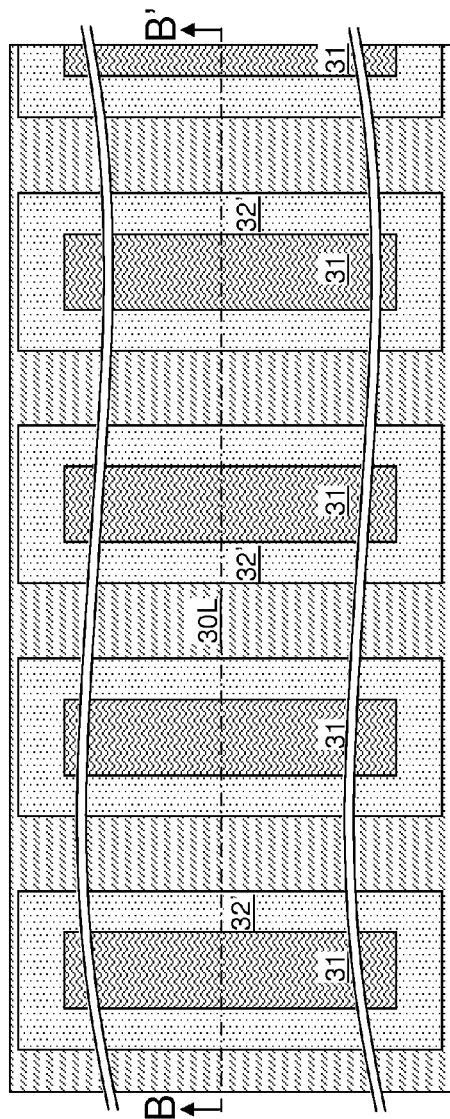
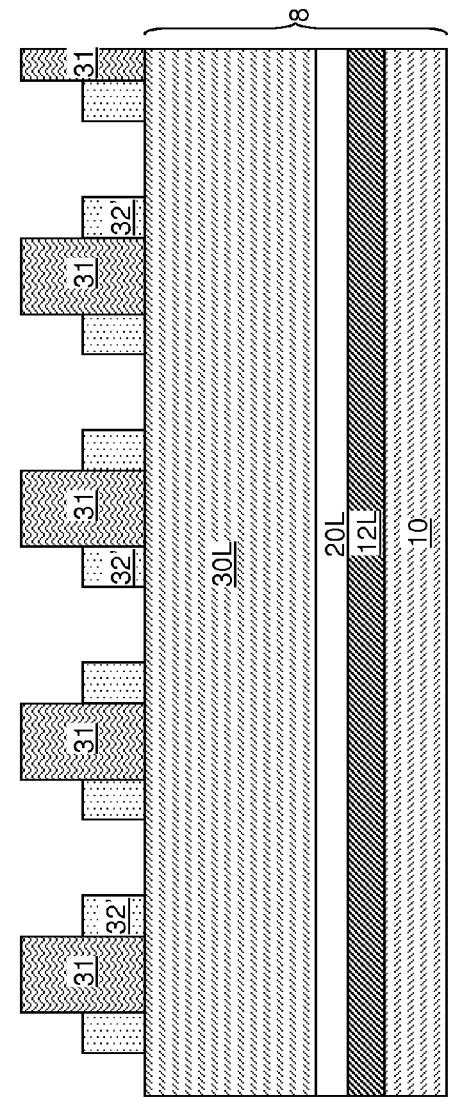
FIG. 1A
FIG. 1B

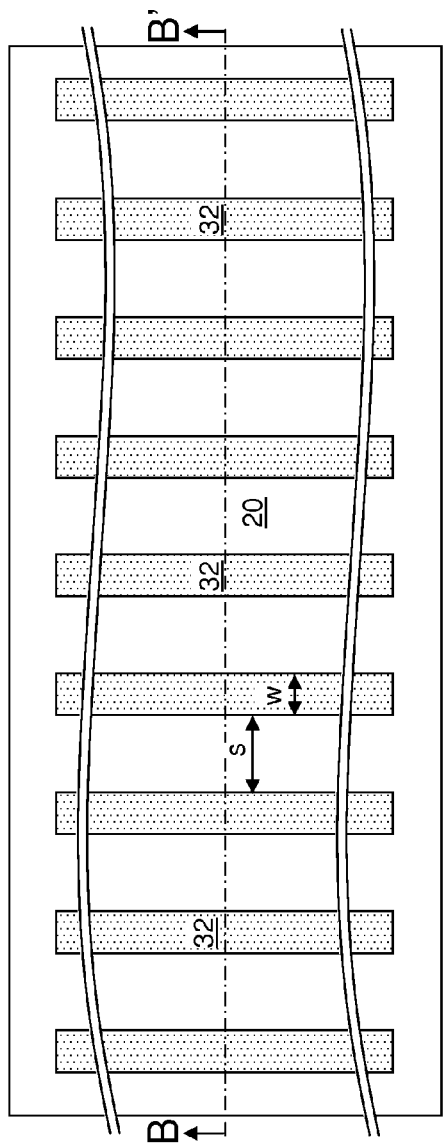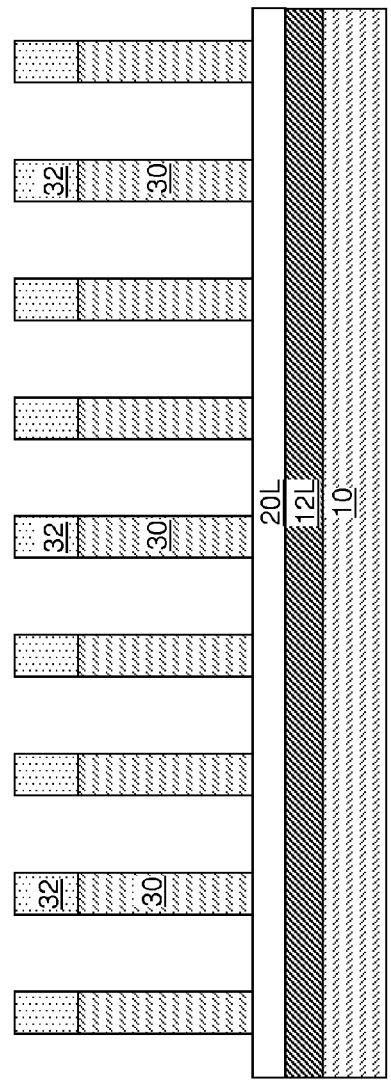

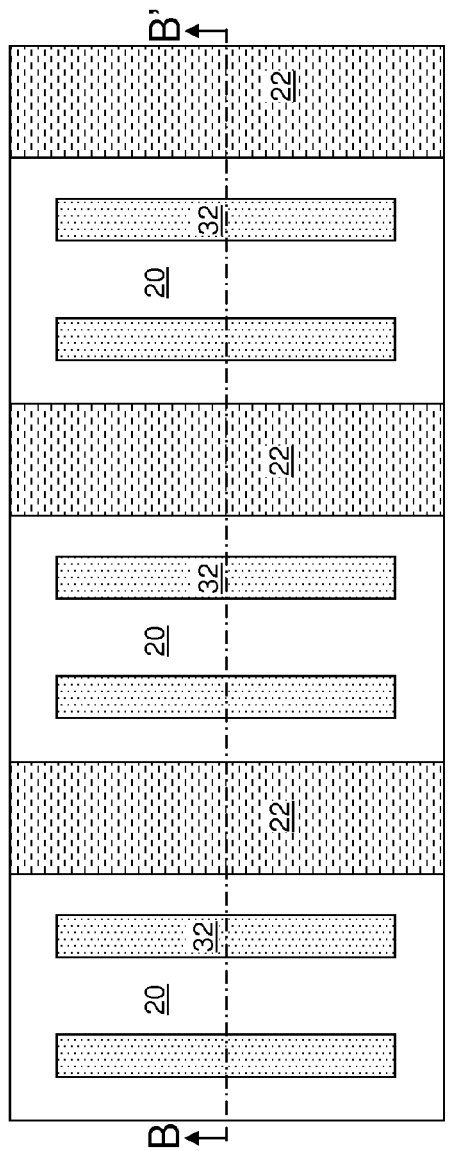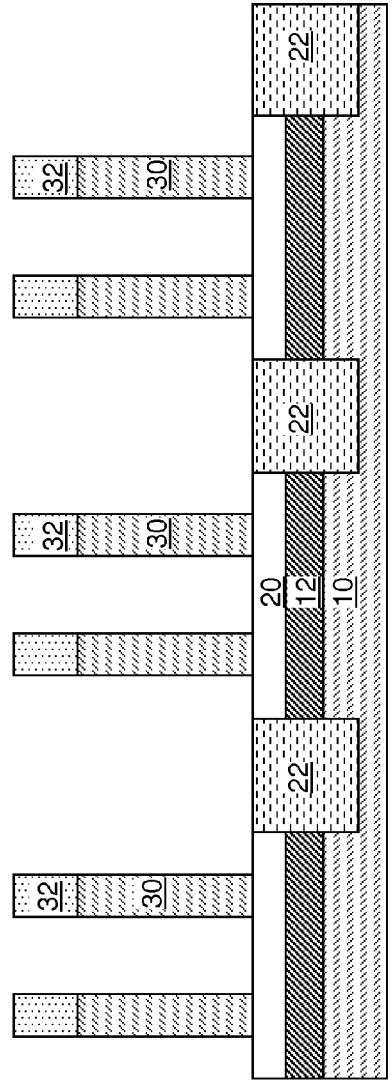

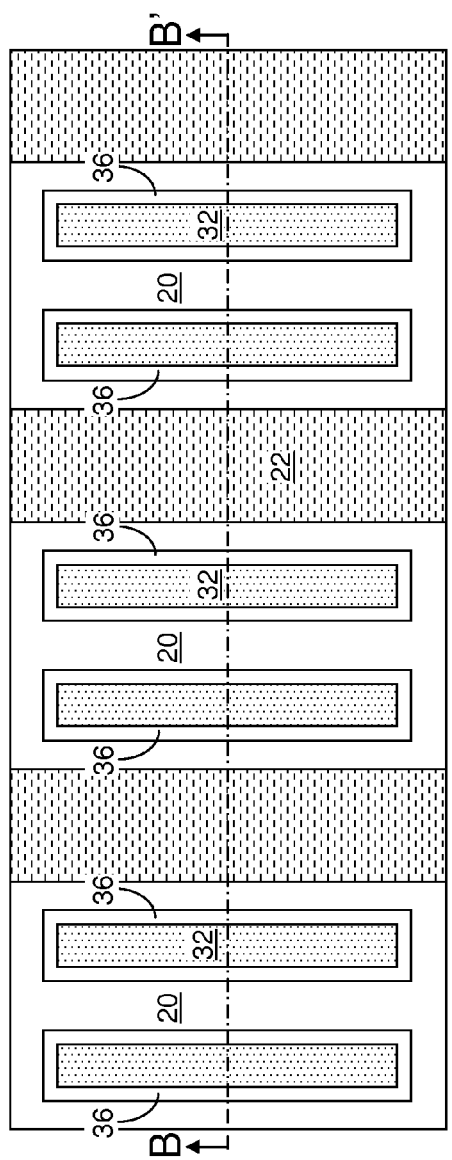
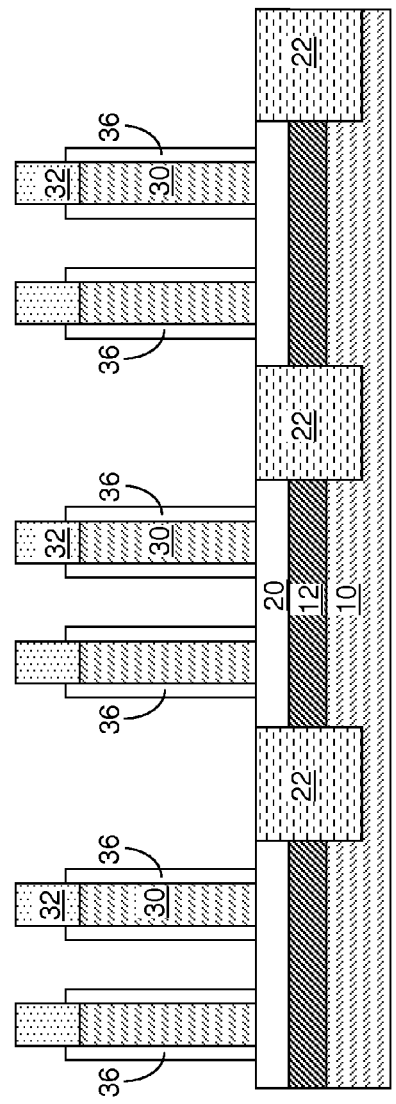
FIG. 7A
FIG. 7B

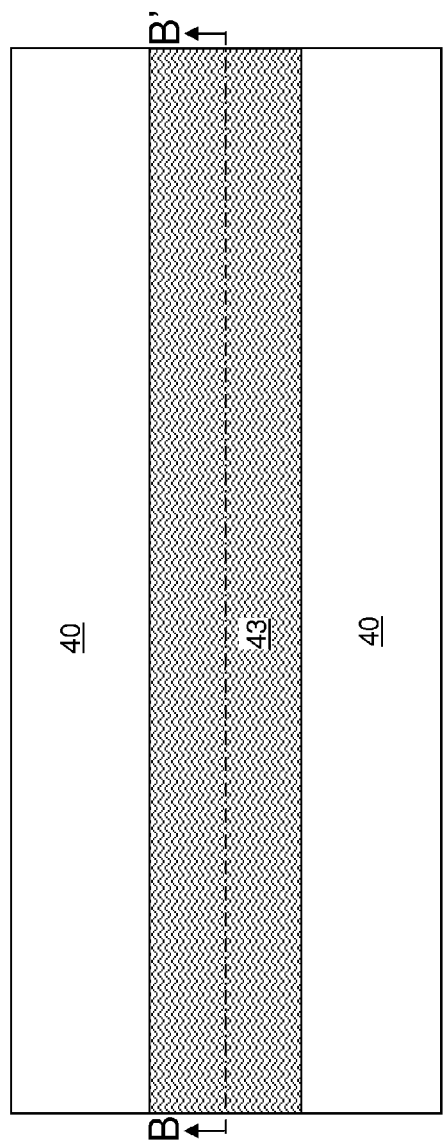
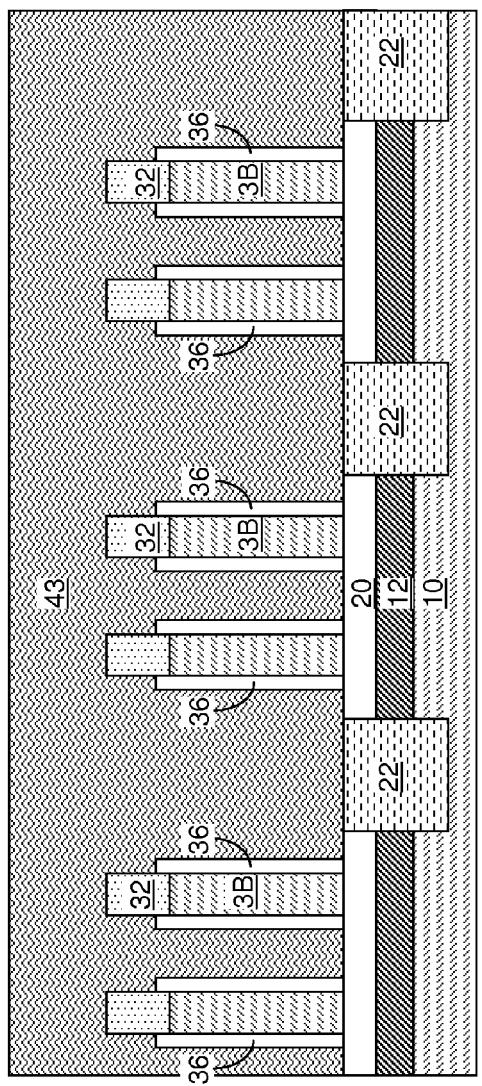
FIG. 9A
FIG. 9B

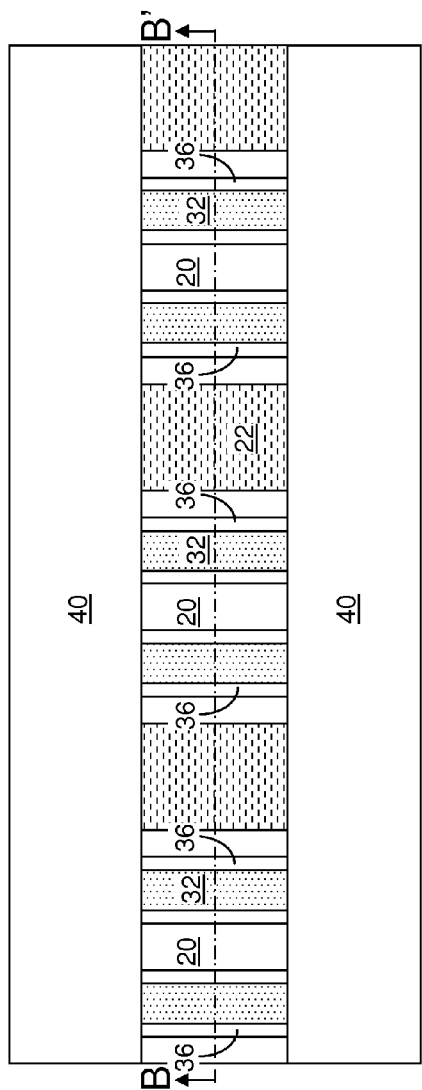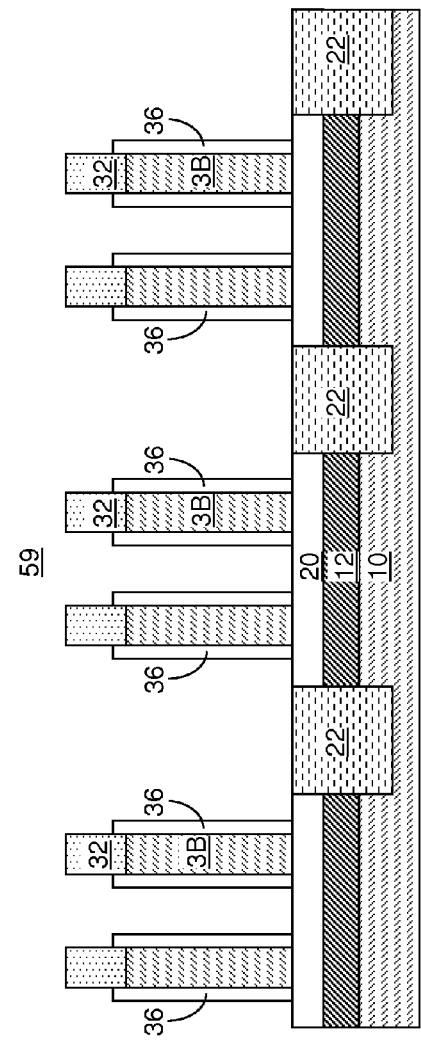
FIG. 10A
FIG. 10B

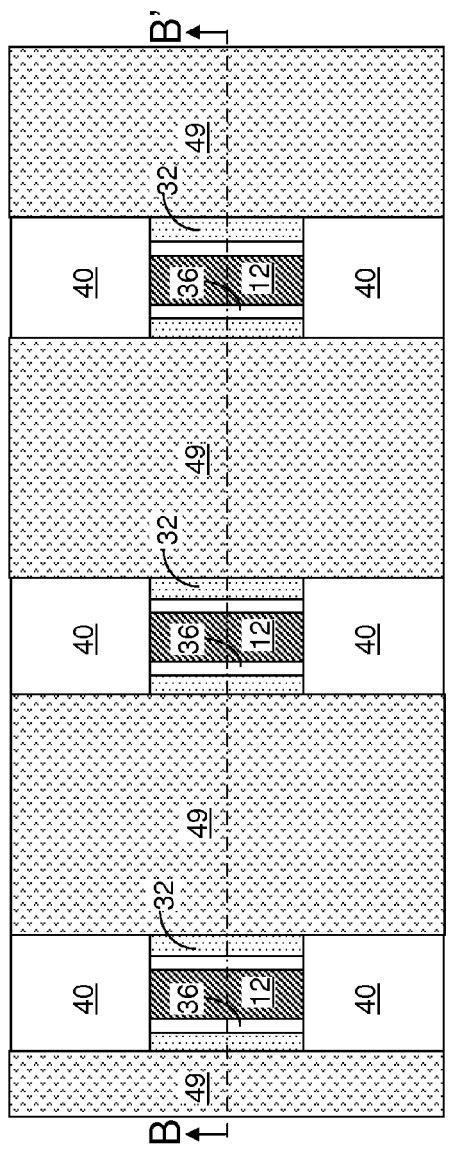
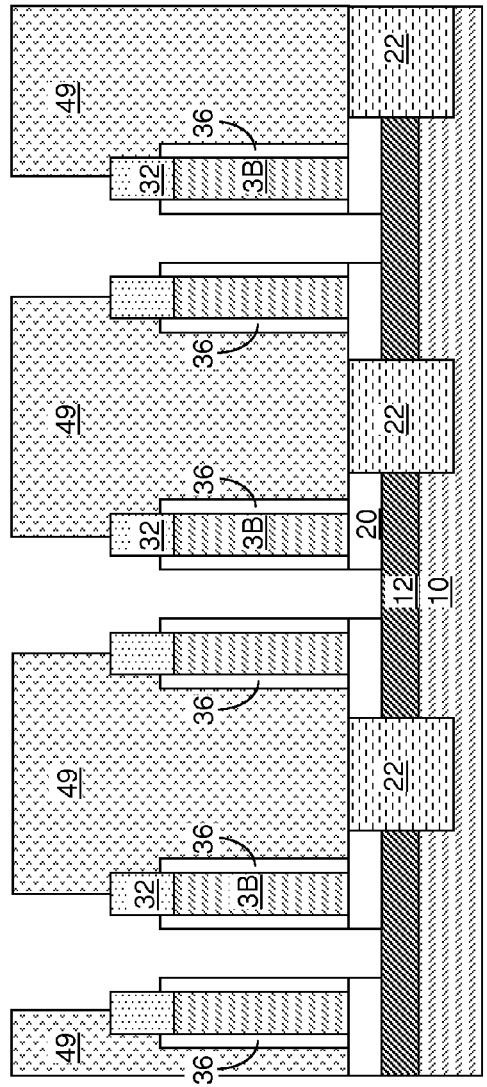
FIG. 11A
FIG. 11B

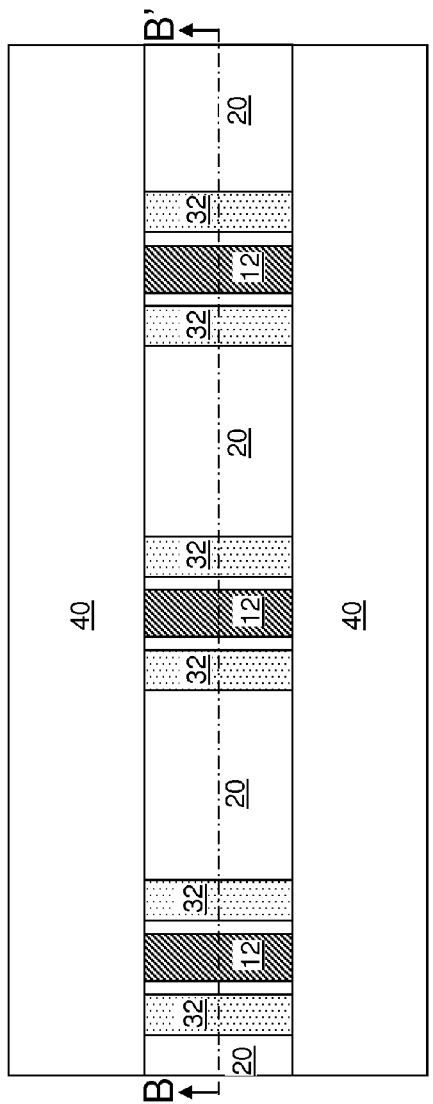
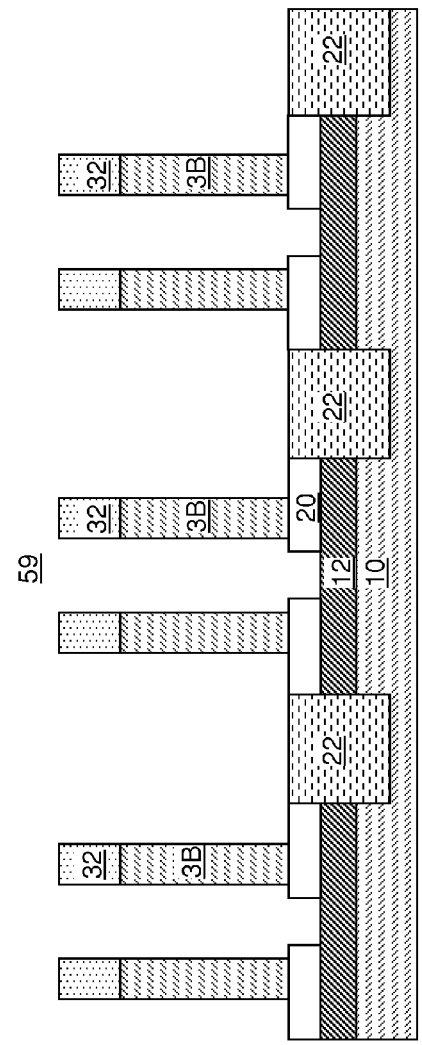
FIG. 12A
FIG. 12B

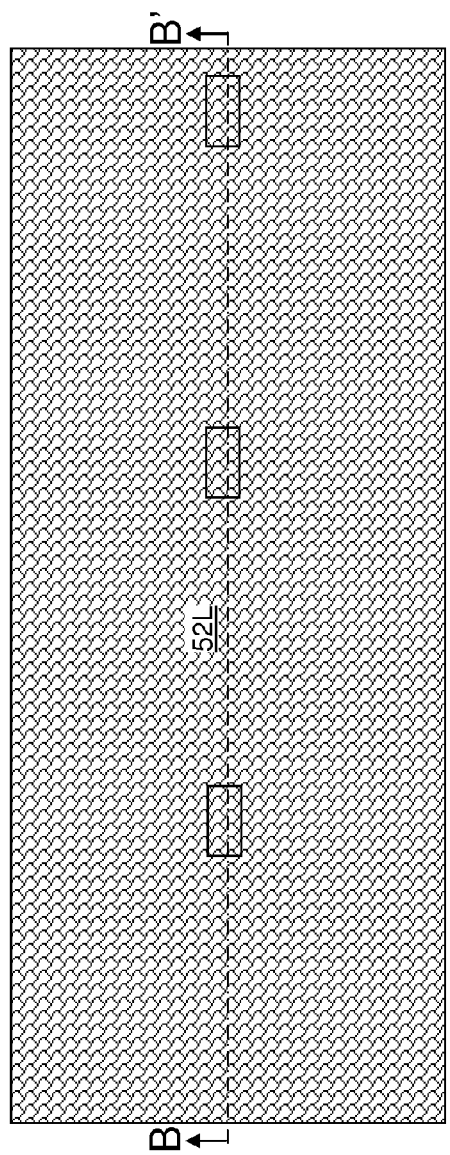
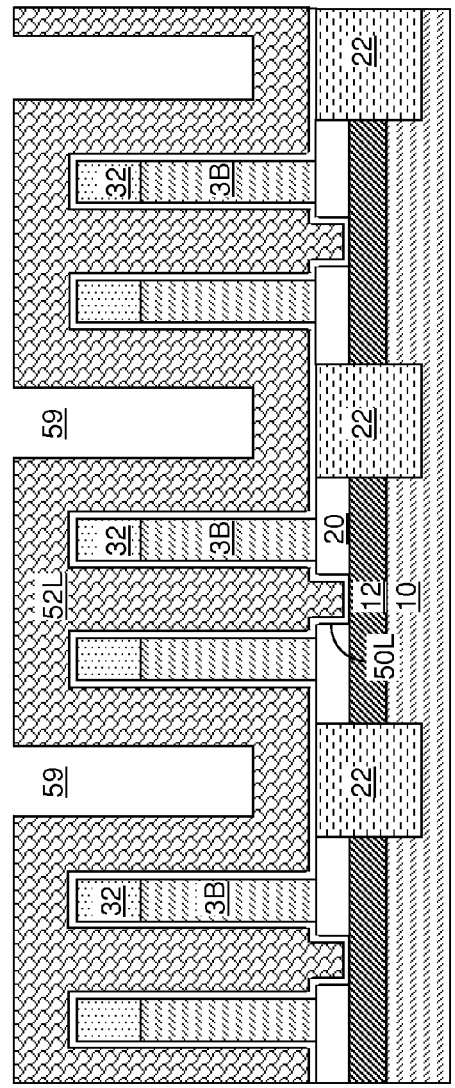
FIG. 13A
FIG. 13B

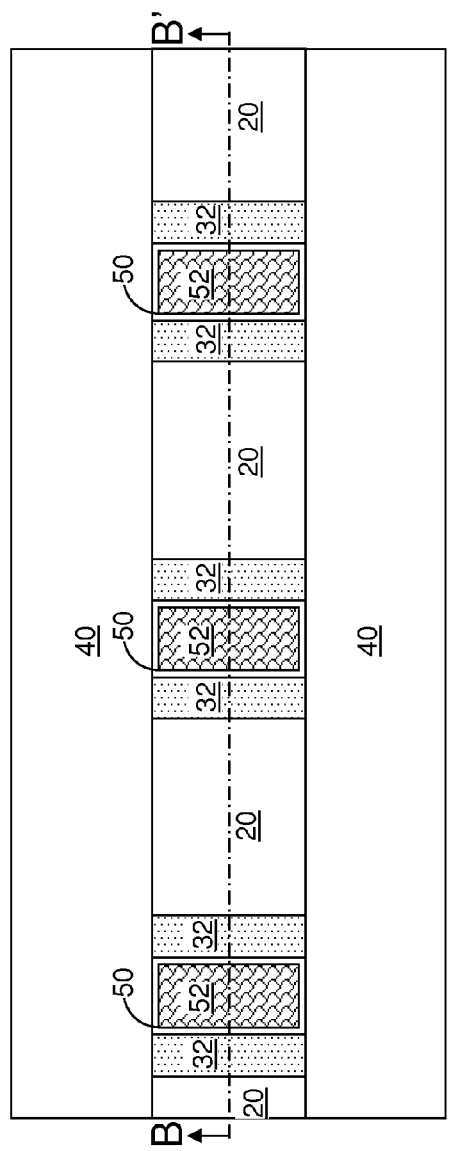
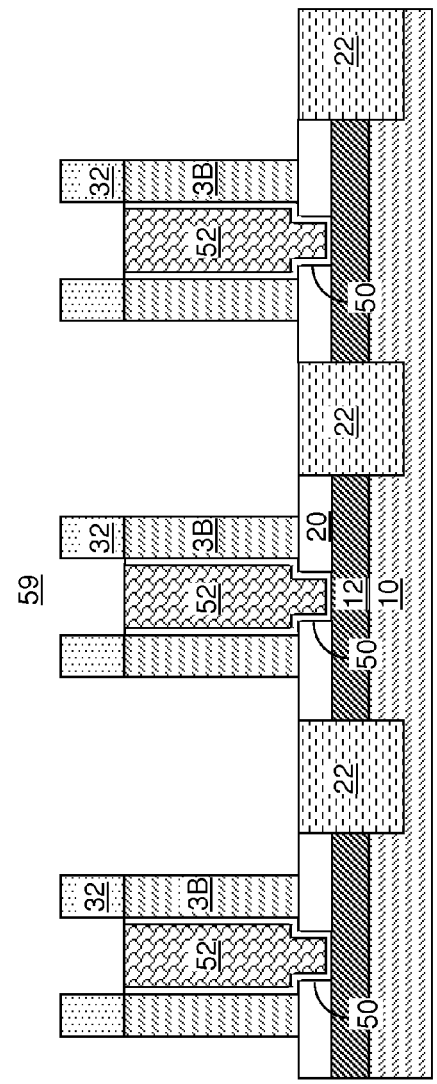

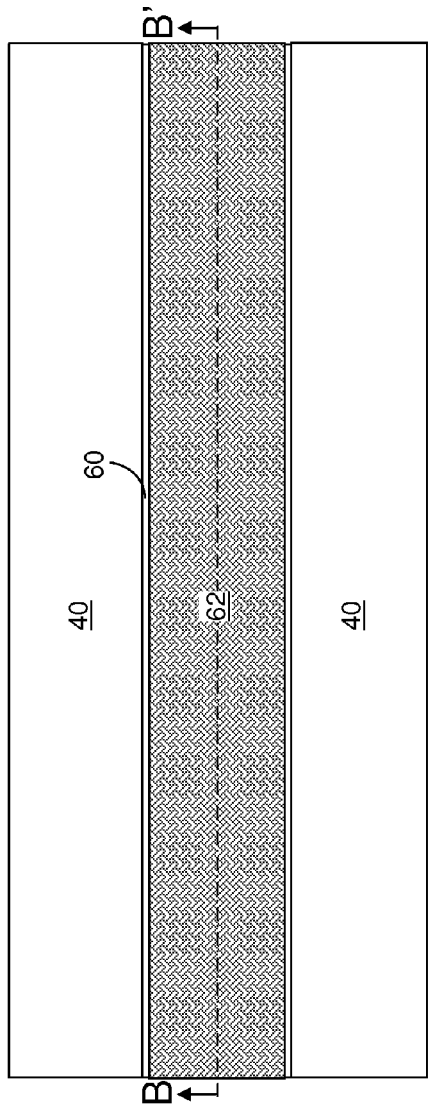
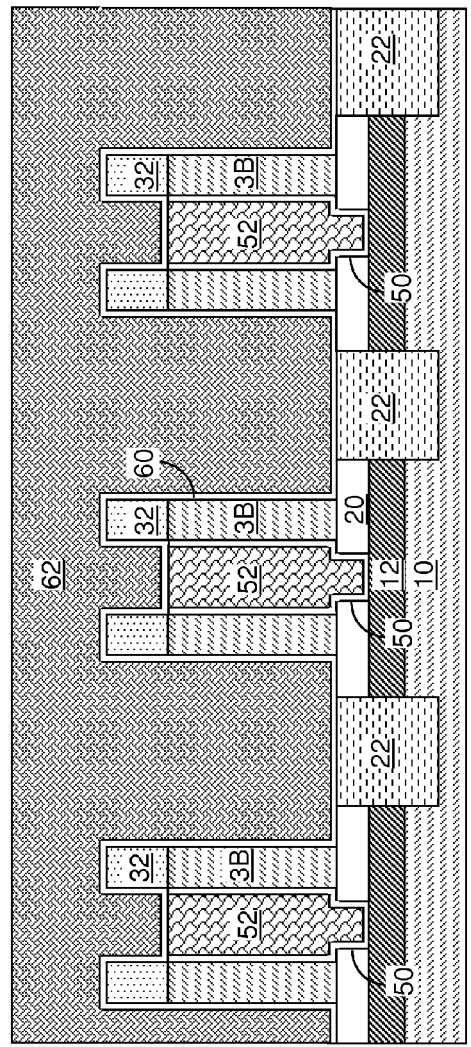
FIG. 15A
FIG. 15B

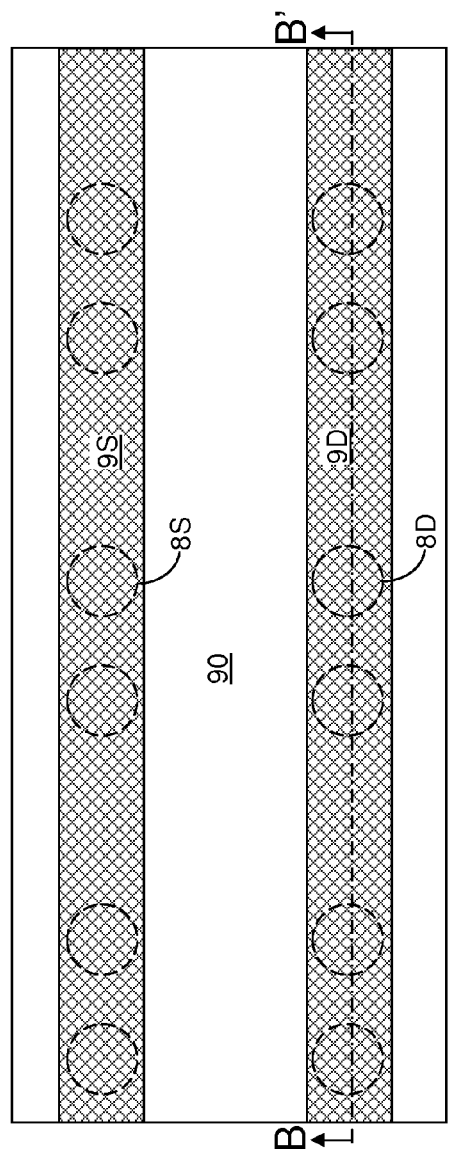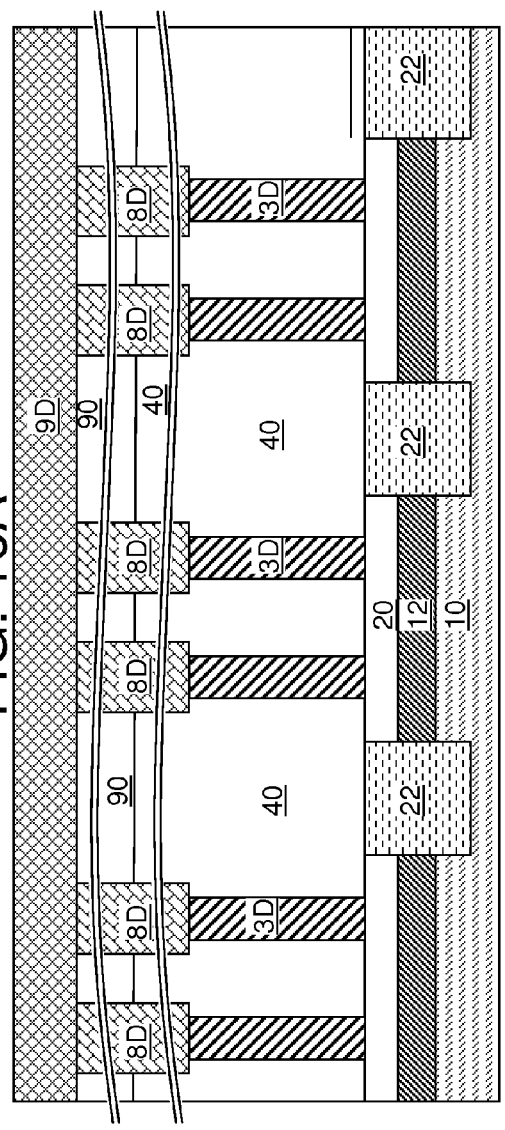

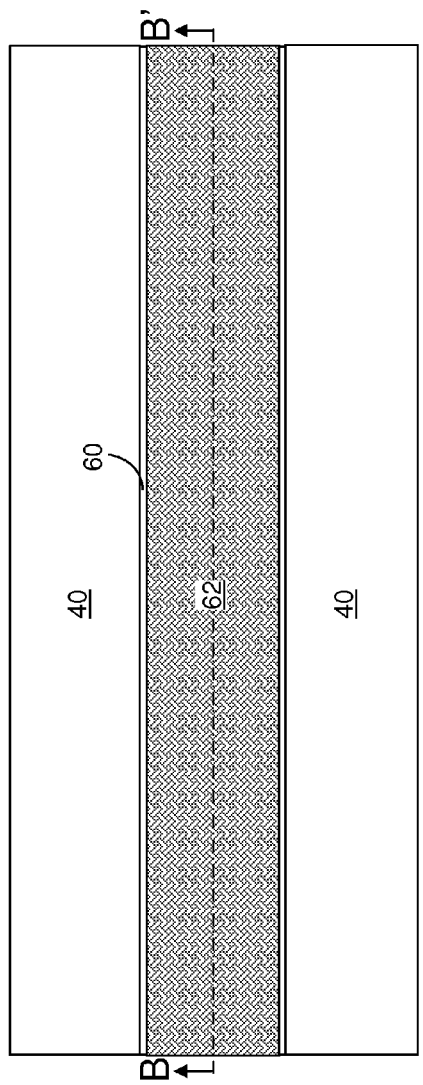
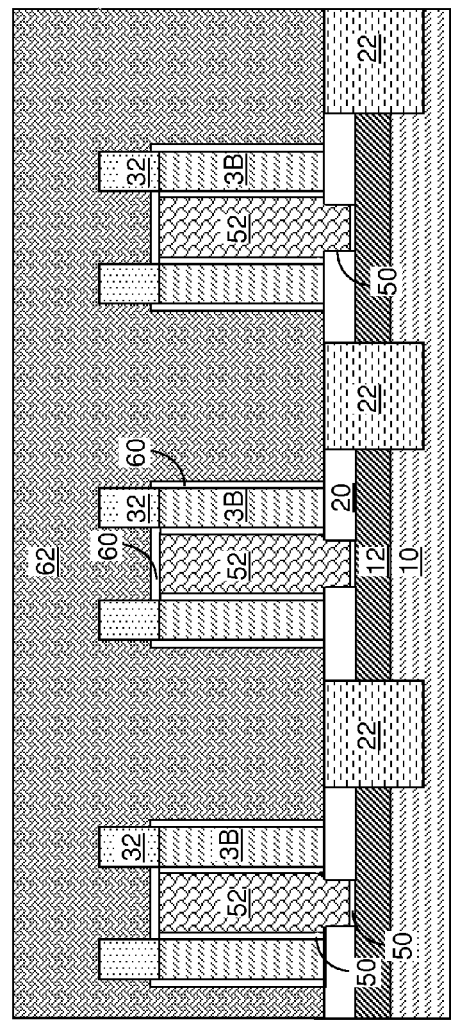
FIG. 17A
FIG. 17B

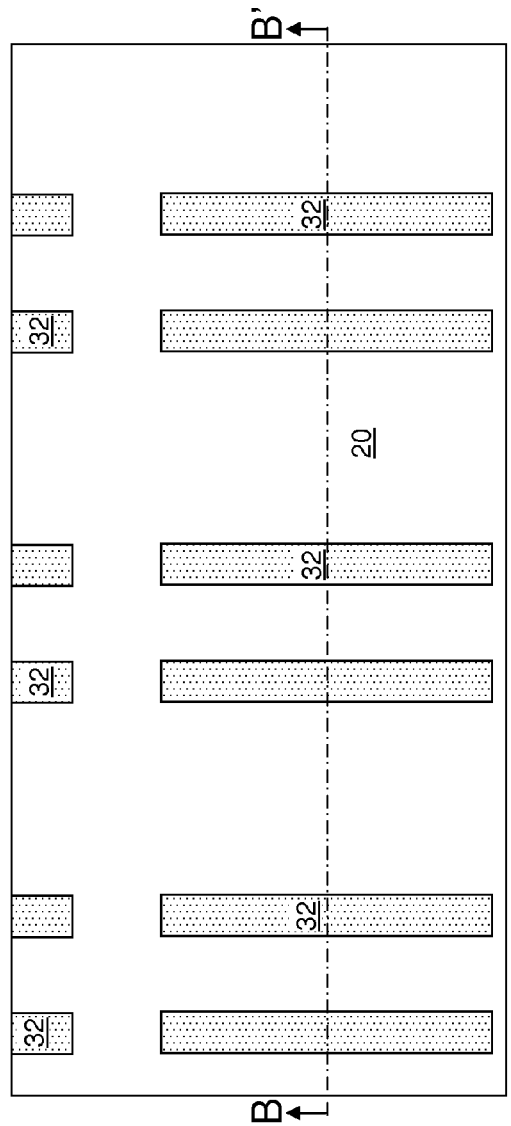
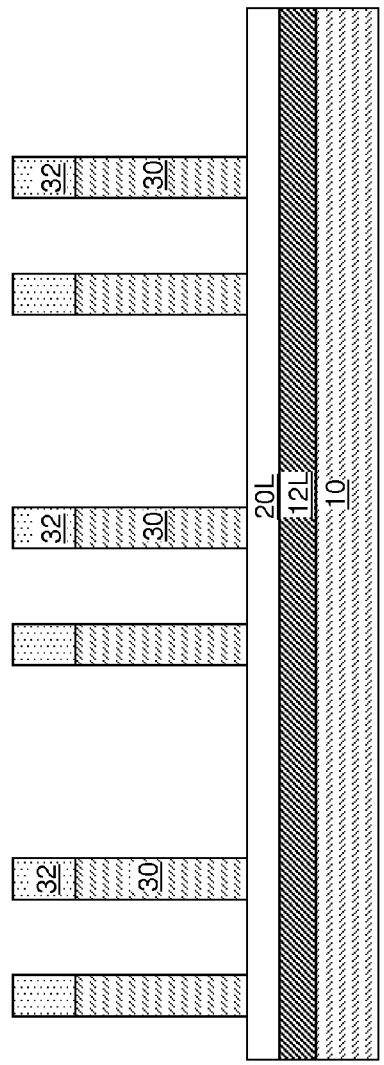
FIG. 18A
FIG. 18B

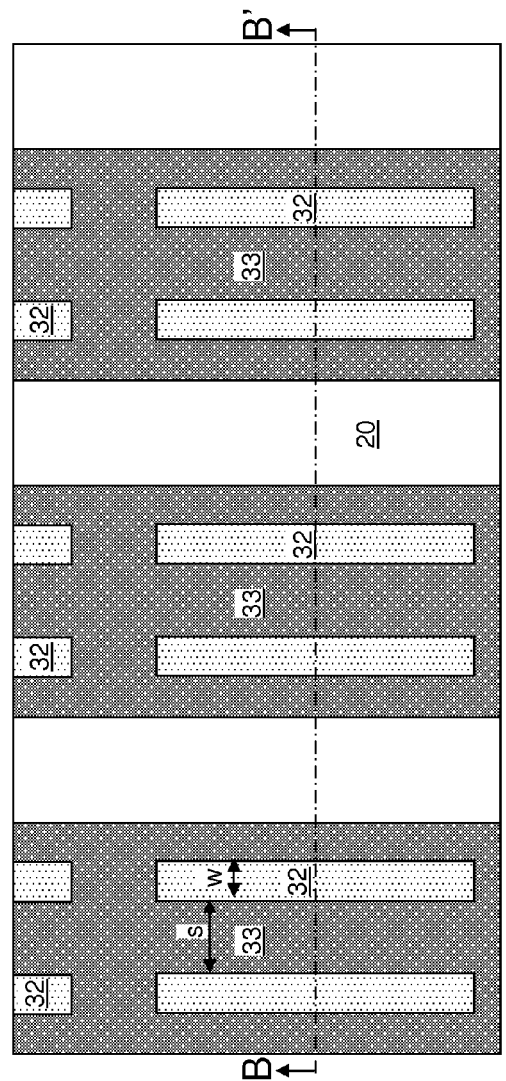
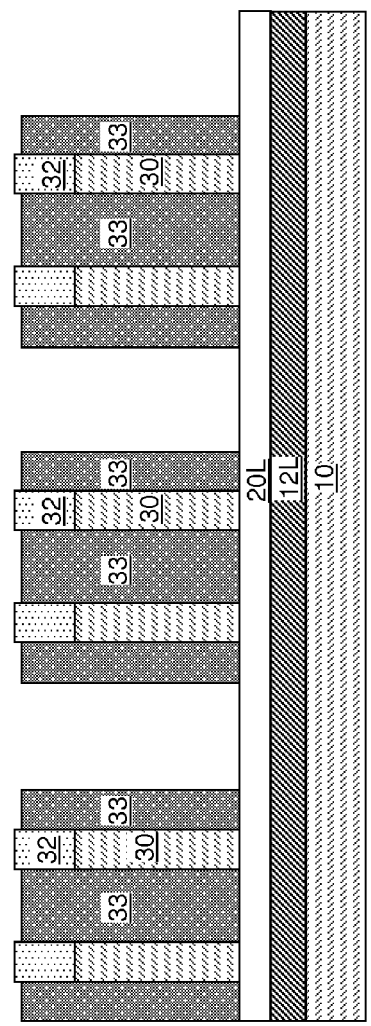
FIG. 19A
FIG. 19B

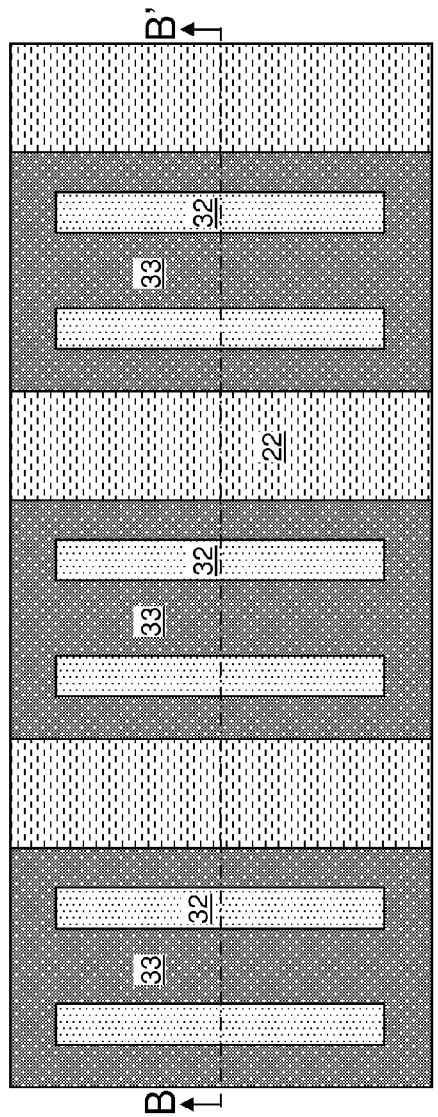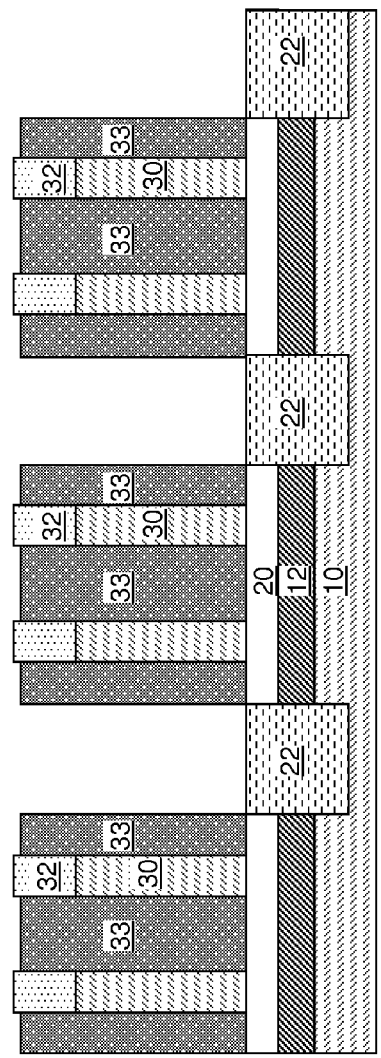

FINFET CROSSPOINT FLASH MEMORY

RELATED APPLICATION

This application is a divisional of U.S. Ser. No. 14/102,843, filed Dec. 11, 2013, the entire contents of which are incorporated herein by reference.

BACKGROUND

The present disclosure relates to a semiconductor device, and more specifically, a flash memory device employing a pair of semiconductor fins and a self-aligned floating gate electrode and a method manufacturing the same.

Flash memory is used commonly in mobile devices, personal computers, servers, digital audio players, digital cameras, synthesizers, and video games. Scaling of currently available flash memory devices is limited due to the inability to scale the amount of electrical charge stored in a floating gate. In the meanwhile, conventional planar field effect transistors are replaced with fin field effect transistors in advanced logic circuitry. In view of the above, a scalable flash memory device based on fin field effect transistors is desired.

SUMMARY

A flash memory device in a dual fin single floating gate configuration is provided. Semiconductor fins are formed on a stack of a back gate conductor layer and a back gate dielectric layer. Pairs of semiconductor fins are formed in an array environment such that shallow trench isolation structures can be formed along the lengthwise direction of the semiconductor fins within the array. After formation of tunneling dielectrics on the sidewalls of the semiconductor fins, a floating gate electrode is formed between each pair of proximally located semiconductor fins by deposition of a conformal conductive material layer and an isotropic etch. A control gate dielectric and a control gate electrode are formed by deposition and patterning of a dielectric layer and a conductive material layer.

According to an aspect of the present disclosure, a semiconductor structure is provided, which includes a pair of semiconductor fins located on a substrate, a tunneling gate dielectric located on sidewalls of the pair of semiconductor fins, a floating gate electrode located between the pair of semiconductor fins and contacting the tunneling gate dielectric, a control gate dielectric contacting sidewalls of the pair of semiconductor fins and a top surface of the floating gate electrode, and a control gate electrode overlying the control gate dielectric.

According to another aspect of the present disclosure, a method of forming a semiconductor structure is provided. A pair of semiconductor fins is formed on a substrate. A tunneling gate dielectric is formed on proximal sidewalls of the pair of semiconductor fins. A floating gate electrode is formed between the pair of semiconductor fins on the sidewalls of the tunneling gate dielectric. A control gate dielectric is formed on distal sidewalls of the pair of semiconductor fins and a top surface of the floating gate electrode. A control gate electrode is formed over the control gate dielectric.

BRIEF DESCRIPTION OF THE SEVERAL VIEWS OF THE DRAWINGS

FIG. 1A is a top-down view of a first exemplary semiconductor structure after formation of mandrel structures and spacer structures over a stack including a back gate conductor layer, a back gate dielectric layer, and a top semiconductor layer according to a first embodiment of the present disclosure.

FIG. 1B is a vertical cross-sectional view of the first exemplary semiconductor structure along the vertical plane B-B' of FIG. 1A.

FIG. 2A is a top-down view of the first exemplary semiconductor structure after removal of the mandrel structures and formation of semiconductor fins employing the spacer structures as an etch mask according to the first embodiment of the present disclosure.

FIG. 2B is a vertical cross-sectional view of the first exemplary semiconductor structure along the vertical plane B-B' of FIG. 2A.

FIG. 6A is a top-down view of the first exemplary semiconductor structure after removal of the patterned mask layer and the disposable fill material layer and formation of shallow trench isolation structures according to the first embodiment of the present disclosure.

FIG. 6B is a vertical cross-sectional view of the first exemplary semiconductor structure along the vertical plane B-B' of FIG. 6A.

FIG. 7A is a top-down view of the first exemplary semiconductor structure after formation of disposable spacers according to the first embodiment of the present disclosure.

FIG. 7B is a vertical cross-sectional view of the first exemplary semiconductor structure along the vertical plane B-B' of FIG. 7A.

FIG. 9A is a top-down view of the first exemplary semiconductor structure after formation of a planarization dielectric layer according to the first embodiment of the present disclosure.

FIG. 9B is a vertical cross-sectional view of the first exemplary semiconductor structure along the vertical plane B-B' of FIG. 9A.

FIG. 10A is a top-down view of the first exemplary semiconductor structure after removal of the disposable gate structure according to the first embodiment of the present disclosure.

FIG. 10B is a vertical cross-sectional view of the first exemplary semiconductor structure along the vertical plane B-B' of FIG. 8A.

FIG. 11A is a top-down view of the first exemplary semiconductor structure after formation of a patterned mask layer to remove physically exposed portions of the back gate dielectric between each pair of semiconductor fins according to the first embodiment of the present disclosure.

FIG. 11B is a vertical cross-sectional view of the first exemplary semiconductor structure along the vertical plane B-B' of FIG. 11A.

FIG. 12A is a top-down view of the first exemplary semiconductor structure after removal of the patterned mask layer and the disposable spacers according to the first embodiment of the present disclosure.

FIG. 12B is a vertical cross-sectional view of the first exemplary semiconductor structure along the vertical plane B-B' of FIG. 12A.

FIG. 13A is a top-down view of the first exemplary semiconductor structure after formation of a floating gate material layer according to the first embodiment of the present disclosure.

FIG. 13B is a vertical cross-sectional view of the first exemplary semiconductor structure along the vertical plane B-B' of FIG. 13A.

FIG. 14A is a top-down view of the first exemplary semiconductor structure after formation of floating gate electrodes by an isotropic etch according to the first embodiment of the present disclosure.

FIG. 14B is a vertical cross-sectional view of the first exemplary semiconductor structure along the vertical plane B-B of FIG. 14A.

FIG. 15A is a top-down view of the first exemplary semiconductor structure after formation of a control gate dielectric and a control gate electrode according to the first embodiment of the present disclosure.

FIG. 15B is a vertical cross-sectional view of the first exemplary semiconductor structure along the vertical plane B-B' of FIG. 15A.

FIG. 16A is a top-down view of the first exemplary semiconductor structure after formation of a contact level dielectric layer, contact via structures, and metal line structures according to the first embodiment of the present disclosure.

FIG. 16B is a vertical cross-sectional view of the first exemplary semiconductor structure along the vertical plane B-B' of FIG. 16A.

FIG. 17A is a top-down view of a variation of the first exemplary semiconductor structure according to the first embodiment of the present disclosure.

FIG. 17B is a vertical cross-sectional view of the variation of the first exemplary semiconductor structure along the vertical plane B-B' of FIG. 17A.

FIG. 18A is a top-down view of a second exemplary semiconductor structure after removal of semiconductor fins in every third column according to a second embodiment of the present disclosure.

FIG. 18B is a vertical cross-sectional view of the second exemplary semiconductor structure along the vertical plane B-B' of FIG. 18A.

FIG. 19A is a top-down view of the second exemplary semiconductor structure after disposable dielectric spacers according to the second embodiment of the present disclosure.

FIG. 19B is a vertical cross-sectional view of the second exemplary semiconductor structure along the vertical plane B-B' of FIG. 19A.

FIG. 20A is a top-down view of the second exemplary semiconductor structure after formation of shallow trench isolation structures according to the second embodiment of the present disclosure.

FIG. 20B is a vertical cross-sectional view of the second exemplary semiconductor structure along the vertical plane B-B' of FIG. 20A.

DETAILED DESCRIPTION

Figure 3A:
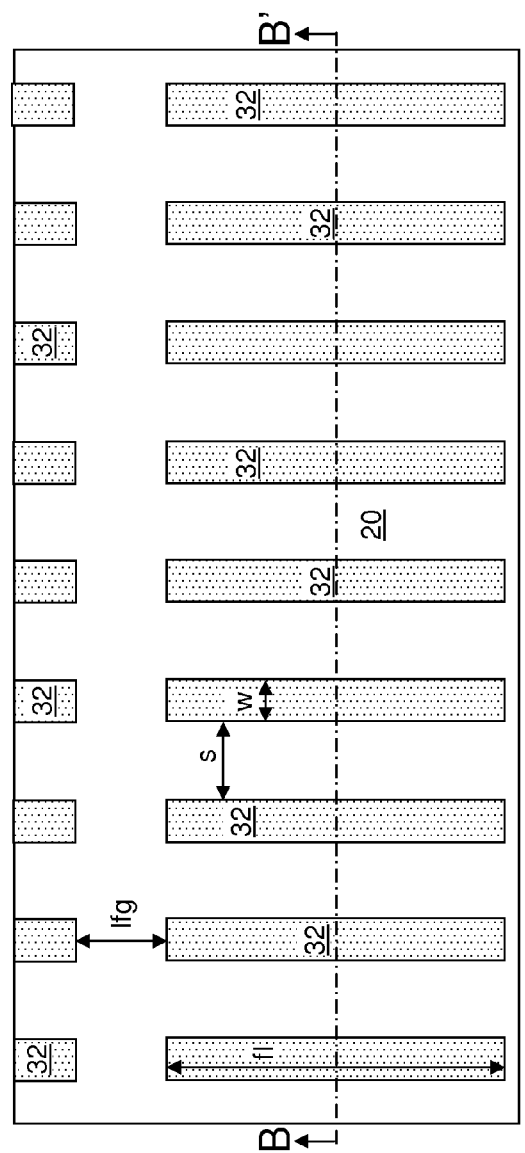
FIG. 3A is a top-down view of the first exemplary semiconductor structure after cutting semiconductor fins along the widthwise direction of the semiconductor fins according to the first embodiment of the present disclosure.

As stated above, the present disclosure relates to a flash memory device employing a pair of semiconductor fins and a self-aligned floating gate electrode and a method manufacturing the same, which are now described in detail with accompanying figures. It is noted that like and corresponding elements mentioned herein and illustrated in the drawings are referred to by like reference numerals. As used herein, ordinals such as "first" and "second" are employed merely to distinguish similar elements, and different ordinals may be employed to designate a same element in the specification and/or claims.

Referring to FIGS. 1A and 1B, a first exemplary semiconductor structure according to a first embodiment of the present disclosure includes a substrate 8. The substrate 8 can be a semiconductor-on-insulator (SOI) substrate including a stack, from bottom to top, of a handle substrate layer 10, a back gate conductor layer 12L, a back gate dielectric layer 20L, and a top semiconductor layer 30L.

The handle substrate layer 10 can include a dielectric material, an intrinsic semiconductor material, or a lightly-doped semiconductor material. As used herein, a lightly-doped semiconductor material refers to a doped semiconductor material having an atomic concentration of electrical dopants in a range from $1.0 \times 10^{14}/cm^3$ to $3.0 \times 10^{17}/cm^3$. As used herein, electrical dopants refer to p-type dopants or n-type dopants. The thickness of the handle substrate layer 10 can be in a range from 30 microns to 1 mm, although lesser and greater thicknesses can also be employed.

The back gate conductor layer 12L includes a conductive material, which can be a heavily-doped semiconductor material, or a metallic material such as a metallic nitride, an elemental metal, or an intermetallic alloy. As used herein, a heavily-doped semiconductor material refers to a doped semiconductor material having an atomic concentration of electrical dopants in a range from $3.0 \times 10^{19}/cm^3$ to $3.0 \times 10^{21}/cm^3$. If the handle substrate layer 10 includes a lightly-doped semiconductor material and the back gate conductor layer 12L includes a heavily doped semiconductor material, the conductivity type of the heavily-doped semiconductor material of the back gate conductor layer 12L is the opposite of the conductivity type of the lightly-doped semiconductor material of the handle substrate layer 10. The thickness of the back gate conductor layer 12L can be in a range from 3 nm to 300 nm, although lesser and greater thicknesses can also be employed. Portions of the back gate conductor layer 12L function as back gate electrodes of a flash memory device to be subsequently formed.

In one embodiment, the handle substrate layer 10 and the back gate conductor layer 12L can be formed by providing a semiconductor-on-insulator substrate including a bottom semiconductor layer underlying a buried insulator layer, and implanting electrical dopants into an upper portion of the bottom semiconductor layer. The implanted portion of the bottom semiconductor layer can become the back gate conductor layer 12L, and the unimplanted portion of the bottom semiconductor layer can be come the handle substrate layer.

The back gate dielectric layer 20L is the buried insulator layer of the semiconductor-on-insulator layer. The back gate dielectric layer 20L includes a dielectric material such as silicon oxide. The thickness of the back gate dielectric layer 20L can be in a range from 10 nm to 100 nm, although lesser and greater thicknesses can also be employed. Portions of the back gate dielectric layer 20L overlie back gate electrodes to be subsequently formed, and provides electrical isolation between the back gate electrodes and semiconductor fins to be subsequently formed.

The top semiconductor layer 30L includes a semiconductor material, which can be an elemental semiconductor material such as silicon or germanium; a semiconductor alloy of Group IV elements such as a silicon-germanium alloy, a silicon-carbon alloy, or a silicon-germanium-carbon alloy; a compound semiconductor material; or an organic semiconductor material. In one embodiment, the entirety of the top semiconductor layer 30L can be single crystalline. In one embodiment, the top semiconductor layer 30L can be a single crystalline silicon layer. The thickness of the top semiconductor layer 30L can be in a range from 30 nm to 300 nm, although lesser and greater thicknesses can also be employed.

An array of mandrel structures 31 is formed on the top surface of the top semiconductor layer 30L. The array of mandrel structures 31 can be formed, for example, by depositing a mandrel material layer (not shown) and patterning the mandrel material layer, for example, by a combination of lithographic methods and an etch, which can be an anisotropic etch or an isotropic etch.

The mandrel structures 31 can include a semiconductor material, a dielectric material, or a conductive material, provided that the material of the mandrel structures 31 is different from the material of the top semiconductor layer 30L. In one embodiment, the mandrel structures 31 can include a silicon-germanium alloy, germanium, amorphous carbon, silicon oxide, silicon oxynitride, silicon nitride, a dielectric metal oxide, a dielectric metal nitride, a photoresist material, an organic material, an elemental metal, an intermetallic alloy, a metal oxide, a metal nitride, or any other material different from the material of the top semiconductor layer 30L. The height of the mandrel structures 31 can be, for example, from 10 nm to 500 nm, although lesser and greater thicknesses can also be employed.

A spacer structure 32' is formed around each mandrel structure 31. The spacer structures 32' can be formed by depositing a spacer material layer (not shown) on the top surface of the top semiconductor layer 30L and on the top surface and sidewalls of the mandrel structures 31, and removing horizontal portions of the spacer material layer by an anisotropic etch, such as a reactive ion etch. The remaining vertical portions of the spacer material layer constitute the spacer structures 32'.

The spacer structures 32' can include a semiconductor material, a dielectric material, or a conductive material, provided that the material of the spacer structures 32' is different from the material of the mandrel structures 31 and from the material of the top semiconductor layer 30L. In one embodiment, the spacer structures 32' can include a silicon-germanium alloy, germanium, amorphous carbon, silicon oxide, silicon oxynitride, silicon nitride, a dielectric metal oxide, a dielectric metal nitride, an organic material, an elemental metal, an intermetallic alloy, a metal oxide, a metal nitride, or any other material different from the material of the top semiconductor layer 30L and from the material of the mandrel structures 31. In an illustrative example, the mandrel structures 31 can include germanium, silicon-germanium alloy, or amorphous carbon, and the spacer structures 32' can include silicon oxide, silicon nitride, or silicon oxynitride. In one embodiment the spacer structures 32' can include silicon oxide.

The thickness of each spacer structure 32', i.e., the lateral dimension between an inner sidewall of the spacer structure 32' and an outer sidewall that is most proximate to the inner sidewall, is not limited by lithographic capabilities of available lithography tools. Thus, the thickness of each spacer structure 32' can be a sublithographic dimension, i.e., a dimension that is less than the smallest dimension that can be printed by single lithographic exposure. In one embodiment, the thickness of a spacer structure 32' can be from 1 nm to 100 nm, although lesser and greater thicknesses can also be employed. In one embodiment, the aspect ratio of a spacer structure 32', i.e., the ratio of the height of the spacer structure 32' to the thickness of the spacer structure 32', can be in a range from 2 to 100.

In one embodiment, the horizontal cross-sectional shape of each mandrel structure 31 can be a rectangle. In one embodiment, the array of mandrel structures 31 can be a one-dimensional periodic array having a periodicity along the direction perpendicular to the lengthwise direction of the mandrel structures 31. As used here, a lengthwise direction of an element is a direction that is parallel to a line passing through the center of mass of the element and providing the least moment of inertia. If the mandrel structures 31 have shapes of rectangular parallelepipeds, the lengthwise direction of each mandrel structure 31 can be the same as the direction of the longest edges of the corresponding parallelepiped.

Referring to FIGS. 2A and 2B, the mandrel structures 31 are removed selective to the spacer structures 32' and the top semiconductor layer 30L by an etch, which can be an isotropic etch or an anisotropic etch. The pattern in the spacer structures 32' is then transferred through the top semiconductor layer 30L employing an anisotropic etch. The spacer structures 32' are employed as an etch mask during the anisotropic etch. The back gate dielectric layer 20L can be employed as an etch stop layer for the anisotropic etch. Each remaining portion of the top semiconductor layer 30L constitutes a semiconductor fin 30 that replicates the horizontal cross-sectional shapes of the overlying spacer structures 32'.

Subsequently, a patterned mask layer employed to remove end portions of the semiconductor fins 30 and the spacer structures 32' that extend along the widthwise direction of the mandrel structures 31 (See FIGS. 1A and 1B). The patterned mask layer can be, for example, a photoresist layer that is removed after truncation of the end portions of each semiconductor fin 32 by ashing.

Remaining portions of the spacer structures 32' and the semiconductor fins 30 form vertical stacks that are laterally spaced from each other along the widthwise direction of the semiconductor fins 30. Each remaining portion of the fin cap structures 32 constitutes a fin cap structure 32 that overlies a semiconductor fin 30. Each stack of a semiconductor fin 30 and a fin cap structure 32 can have a rectangular horizontal cross-sectional shape. Each semiconductor fin 30 can have a shape of a rectangular parallelepiped.

In one embodiment, the vertical stacks of semiconductor fins 30 and the fin cap structures 32 can form a one-dimensional array having a periodicity along the widthwise direction of the semiconductor fins 30. The periodicity can be the sum of the width w of a semiconductor fin 30 and a spacing s between a neighboring pair of semiconductor fins 30.

Figure 3B:
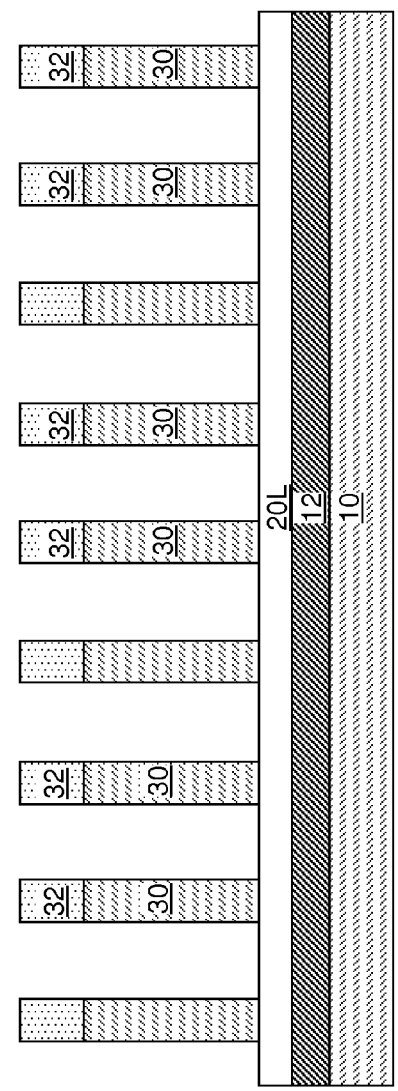
FIG. 3B is a vertical cross-sectional view of the first exemplary semiconductor structure along the vertical plane B-B' of FIG. 3A.

Referring to FIGS. 3A and 3B, the vertical stacks of semiconductor fins 30 and the fin cap structures 32 can be further cut along the widthwise direction of the semiconductor fins 30. For example, a photoresist layer can be applied over the vertical stacks of semiconductor fins 30 and the fin cap structures 32, and can be lithographically patterned to cover a plurality of rectangular regions extending along the widthwise direction of the semiconductor fins 30 and spaced from each other by a dimension herein referred to as a lengthwise fin gap lfg. The length of each patterned portion of the photoresist layer along the lengthwise direction of the semiconductor fins 30 can be the same, which is herein referred to as the fin length fl. In one embodiment, the lengthwise fin gap lfg can be less than twice the spacing s between a neighboring pair of semiconductor fins 30 that are separated from each other along the widthwise direction.

In one embodiment, the patterned portions of the photoresist layer can have rectangular shapes, and can have a periodicity along the lengthwise direction of the semiconductor fins 30. In one embodiment, each semiconductor fin 30 as provided after the processing steps of FIGS. 2A and 2B can be divided into N semiconductor fins 30 of equal length by an anisotropic etch that employs the photoresist layer as an etch mask. Each divided semiconductor fin 30 can have the fin length fl and separated from a neighboring semiconductor fin 30 by the lengthwise fin gap lfg along the lengthwise direction of the semiconductor fins 30. N is an integer greater than 2, and can be as large as $2^{20}$. The photoresist layer can be subsequently removed, for example, by ashing. In this case, the semiconductor fins 30 as divided can form a two dimensional array having a first periodicity in the lengthwise direction at a first pitch of the sum of the fin length fl and the lengthwise fin gap lfg, and having a second periodicity in the widthwise direction at a second pitch of the sum of the width w and the spacing s.

Figure 4A:
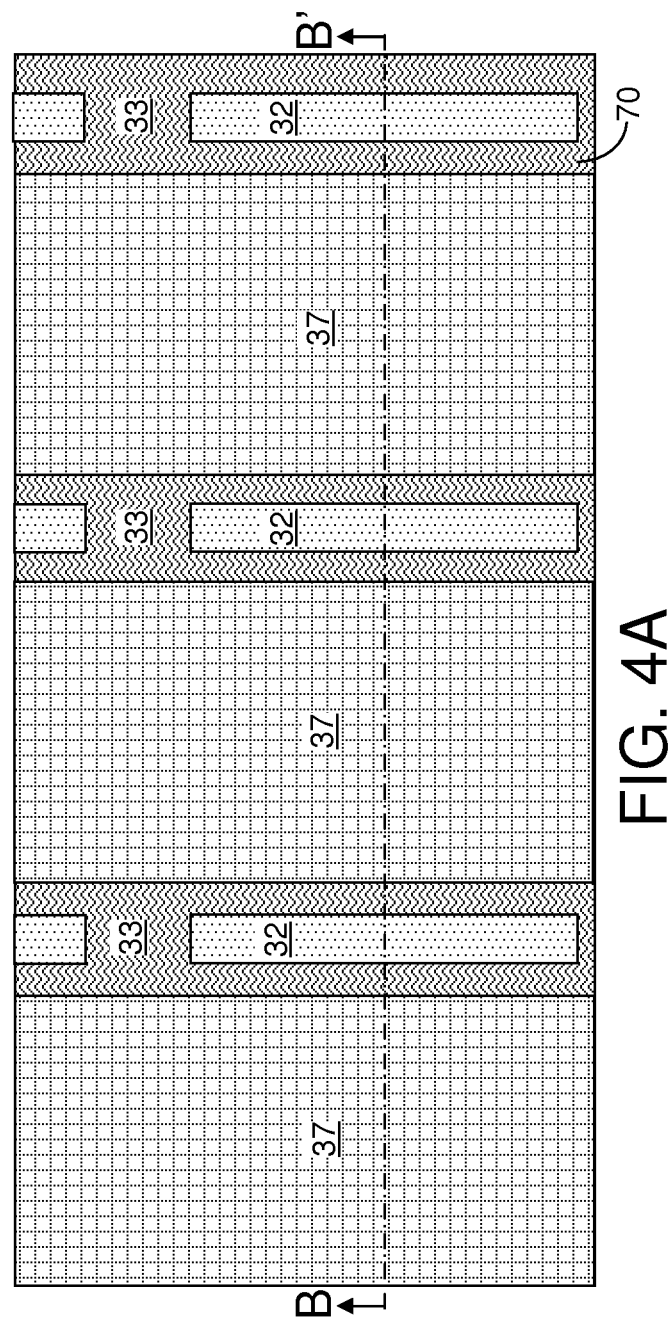
FIG. 4A is a top-down view of the first exemplary semiconductor structure after formation of a disposable fill material layer and a patterned mask layer according to the first embodiment of the present disclosure.
Figure 4B:
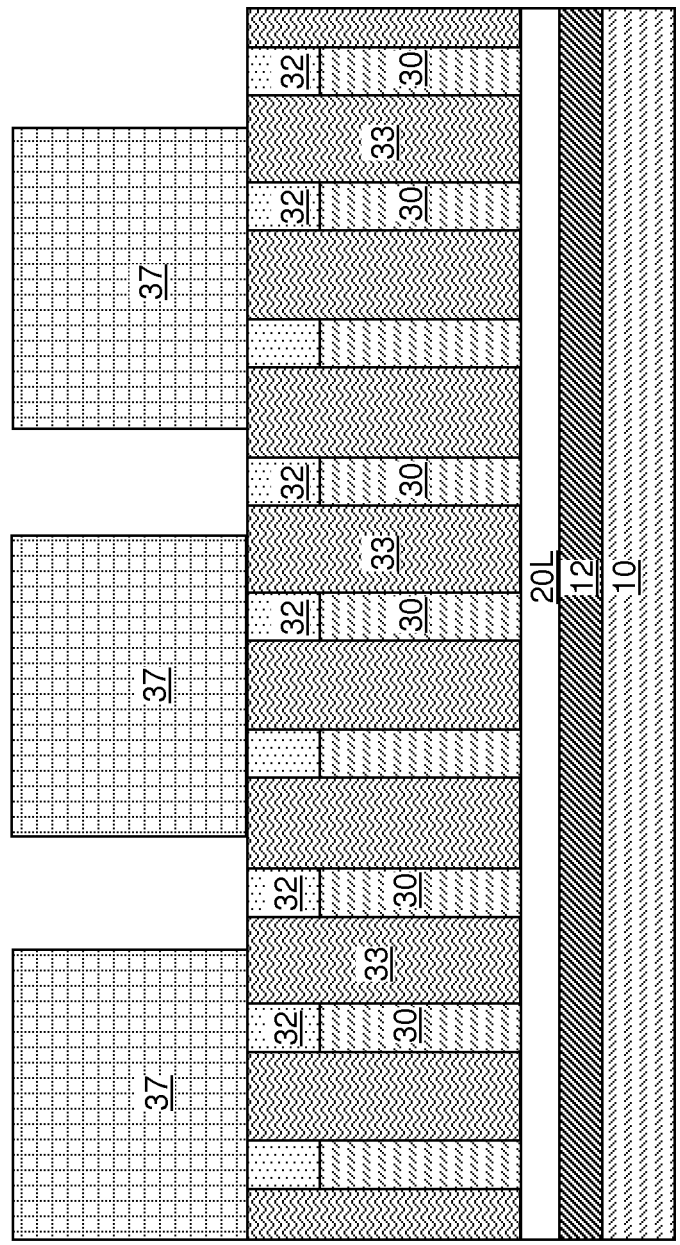
FIG. 4B is a vertical cross-sectional view of the first exemplary semiconductor structure along the vertical plane B-B' of FIG. 4A.

Referring to FIGS. 4A and 4B, a disposable fill material layer 33 is formed over the vertical stacks of semiconductor fins 30 and the fin cap structures 32, and is subsequently planarized employing the top surfaces of the fin cap structures 32 as stopping surfaces. The material of the disposable fill material layer 33 can include a semiconductor material, a dielectric material, or a conductive material, provided that the material of the disposable fill material layer 33 is different from the materials of the back gate dielectric layer 20L, the semiconductor fins 30, and the fin cap structures 32. In one embodiment, the disposable fill material layer 33 can include a silicon-germanium alloy, germanium, amorphous carbon, silicon oxynitride, silicon nitride, a dielectric metal oxide, a dielectric metal nitride, an organic material, an elemental metal, an intermetallic alloy, a metal oxide, a metal nitride, or any other material different from the materials of the back gate dielectric layer 20L, the semiconductor fins 30, and the fin cap structures 32. In an illustrative example, the back gate dielectric layer 20L can include silicon oxide, the semiconductor fins 30 can include single crystalline silicon, the fin cap structures 32 can include silicon nitride, and the disposable fill material layer 33 can include germanium, amorphous carbon, a dielectric metal oxide, a dielectric metal nitride, an organic material, an elemental metal, an intermetallic alloy, a metal oxide, or a metal nitride. The top surface of the disposable fill material layer 33 can be coplanar with the top surfaces of the fin cap structures 32.

A first patterned mask layer 37 is formed over the disposable filler material layer 33 and the vertical stacks of the semiconductor fins 30 and the fin cap structures 32. The first patterned mask layer 37 can be a lithographically patterned photoresist layer. The pattern in the patterned mask layer 37 can be selected such that top surfaces of the fin cap structures 32 within every third column in the two-dimensional array of the vertical stacks of the semiconductor fins 30 and the fin cap structures 32 are physically exposed, while masking the top surface of other fin cap structures 32 therebetween. As used herein, the columns of the two-dimensional array of the vertical stacks of the semiconductor fins 30 and the fin cap structures 32 are counted along the widthwise direction of the semiconductor fins 30, and the rows of the two-dimensional array of the vertical stacks of the semiconductor fins 30 and the fin cap structures 32 are counted are counted along the lengthwise direction of the semiconductor fins 30.

Figure 5A:
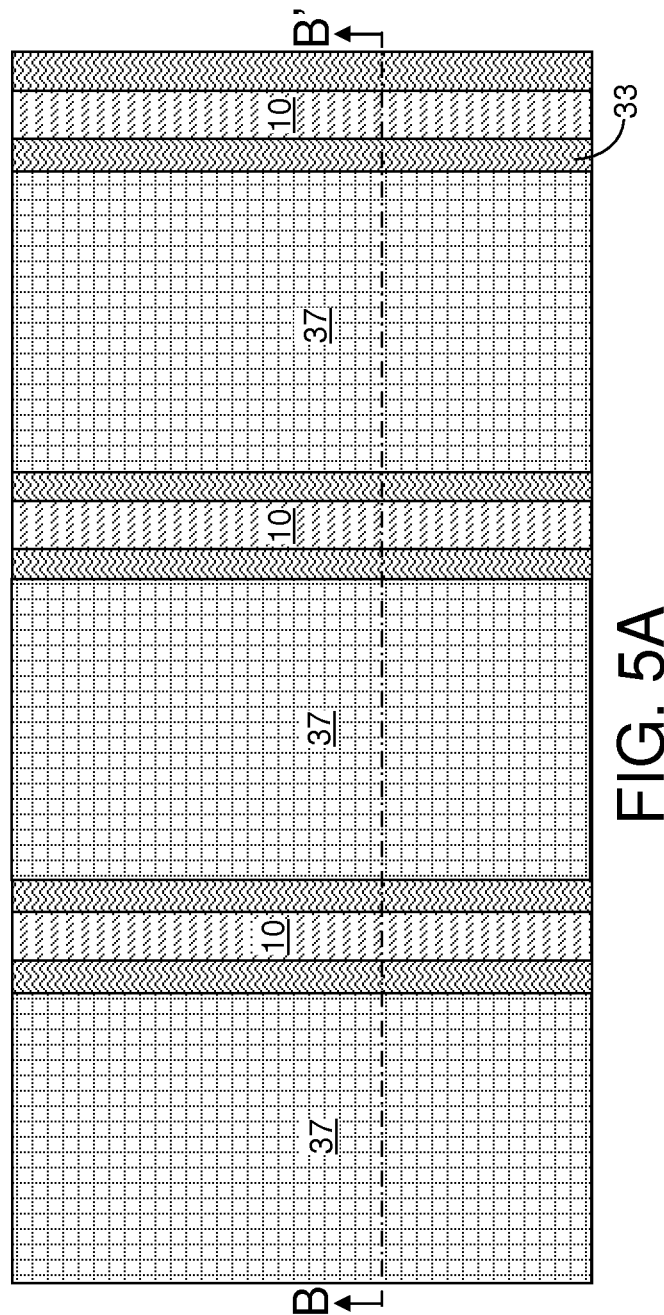
FIG. 5A is a top-down view of the first exemplary semiconductor structure after selective removal of fin cap structures, semiconductor fins, and portions of the back gate dielectric layer, the back gate conductor layer, and a substrate layer according to the first embodiment of the present disclosure.
Figure 5B:
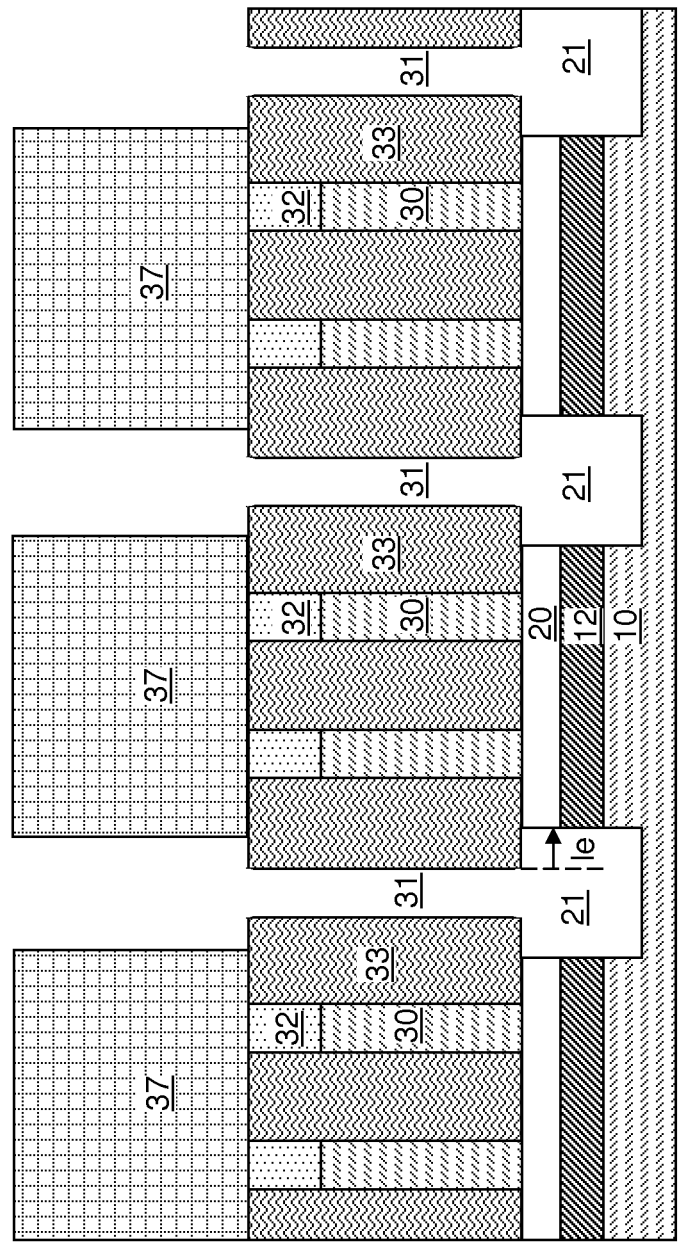
FIG. 5B is a vertical cross-sectional view of the first exemplary semiconductor structure along the vertical plane B-B' of FIG. 5A.

Referring to FIGS. 5A and 5B, physically exposed fin cap structures 32 are removed by an etch that employs the first patterned mask layer 37 as an etch mask. The etch can be an anisotropic etch or an isotropic etch. The etch may, or may not, be selective to the material of the disposable filler material layer 33.

Subsequently, semiconductor fins 30 within the areas of the openings in the first patterned mask layer 37 is removed by another etch, which can be an isotropic etch or an anisotropic etch. The first patterned mask layer 37 can be employed as an etch mask. The etch can be selective to the material of the disposable filler material layer 33. A line cavity 31 is formed within each volume from which a vertical stack of a semiconductor fin 30 and a fin cap structure 32 is removed. As used herein, a line cavity 31 refers to a cavity having a uniform width throughout.

Portions of the back gate dielectric layer 20L, the back gate conductor layer 12, and the handle substrate layer 10 can be etched by at least one isotropic etch and optionally by at least one anisotropic etch from underneath each line cavity 31 to form a shallow trench 21. A lateral etching of sidewalls of the back gate dielectric layer 20L, the back gate conductor layer 12, and the handle substrate layer 10 occur during the at least one isotropic etch so that each shallow trench 21 is laterally expanded. In one embodiment, the lateral extension distance le by which each shallow trench 21 laterally expands from the sidewalls of the line cavities 31 can be less than the spacing s (See FIG. 3A) between neighboring semiconductor fins 30, and is greater than one half of the lengthwise fin gap lfg (See FIG. 3A). In this case, the shallow trenches 21 within the same column of the two-dimensional array of the vertical stacks of the semiconductor fins 30 and the fin cap structures 32 merge with each other, and contiguously extend along the distance of at least N times the sum of the fin length fl (See FIG. 3A) and the lengthwise fin gap lfg. Each pair of semiconductor fins 30 located between a pair of line trenches 31 that neighbor each other along the widthwise direction is protected from the various etch processes by the first patterned mask layer 37.

Each remaining portion of the back gate dielectric layer 20L between a neighboring pair of shallow trenches 21 constitutes a back gate dielectric 20. Each remaining portion of the back gate conductor layer 12L between a neighboring pair of shallow trenches 21 constitutes a back gate electrode 12. A vertical stack including a back gate dielectric 20 and a back gate electrode 12 is formed in the substrate (10, 12, 20) and underneath pairs of semiconductor fins 30 that are located within a pair of neighboring columns of semiconductor fins 30. Each vertical stack of a back gate dielectric 20 and a back gate electrode 12 can contiguously extend underneath N pairs of semiconductor fins 30. The N pairs of semiconductor fins 30 between a neighboring pair of shallow trenches 21 can be located within the area defined by the periphery of the back gate electrode 12 underlying the N pairs of semiconductor fins 30.

Referring to FIGS. 6A and 6B, the first patterned mask layer 37 and the disposable fill material layer 33 are removed selective to the materials of the semiconductor fins 30, the back gate dielectrics 20, and the back gate electrodes 12. If the first patterned mask layer 37 is a patterned photoresist layer, the first patterned mask layer 37 can be removed by ashing. The disposable fill material layer 33 can be removed by ashing, a dry etch, and/or a wet etch.

Additional shallow trenches (not shown) may be formed employing methods known in the art to form electrical isolation among various semiconductor devices (not shown) that can be formed on the same substrate (10, 12, 20).

Shallow trench isolation structures 22 can be formed by depositing a dielectric material in the shallow trenches 21. The dielectric material of the shallow trench isolation structures 22 can be deposited by a self-planarizing deposition method such as spin-coating. Alternatively, the dielectric material of the shallow trench isolation structures 22 can be deposited by a non-self-planarizing deposition method such as chemical vapor deposition, planarized employing the top surfaces of the fin cap structures 32 as stopping surfaces, and subsequently recessed. The dielectric material that can be employed for the shallow trench isolation structures 22 can be, for example, doped silicate glass (such as borosilicate glass, borophosphosilicate glass, and fluorosilicate glass), organosilicate glass (OSG), silicon oxynitride, and/or a dielectric metal oxide. The top surfaces of the shallow trench isolation structures can be coplanar with, raised above, or recessed below, the top surfaces of the back gate dielectrics 20.

In one embodiment, sidewalls of each back gate electrode 12 and each back gate dielectric 20 can contact sidewalls of the shallow trench isolation structures 22. Each neighboring pair of back gate electrodes 12 is electrically isolation from each other by a shallow trench isolation structure 22 therebetween.

Each shallow trench isolation structure 22 includes a dielectric material, is embedded in the substrate (10, 12, 20), and laterally extends along the lengthwise direction of the semiconductor fins 30. A sidewall of each back gate dielectric 20 and a sidewall of each back gate electrode can contact a sidewall of a shallow trench isolation structure 22. In one embodiment, the sidewalls of a back gate dielectric 20 and a sidewall of an underlying back gate electrode 12 can be vertically coincident with each other. As used herein, a first surface and a second surface are vertically coincident with each other if the first and second surfaces are within a same vertical plane.

Referring to FIGS. 7A and 7B, disposable spacers 36 are formed on the sidewalls of the semiconductor fins 30 and the fin cap structures 32. The disposable spacers 36 include a material different from the semiconductor material of the semiconductor fins 30. For example, the disposable spacers 36 can include a dielectric material such as silicon nitride, silicon oxide, a dielectric metal oxide, a dielectric metal nitride, and amorphous carbon, or a metallic material such as a metallic nitride or a metallic carbide. The disposable spacers 36 can be formed, for example, by depositing a conformal disposable material layer on the physically exposed surfaces of the back gate dielectrics 20, the shallow trench isolation structures 22, the semiconductor fins 30, and the fin cap structures 32, and anisotropically etching the conformal disposable material layer. Horizontal portions of the conformal disposable material layer are removed by the anisotropic etch, and remaining vertical portions of the conformal disposable material layer constitute the disposable spacers 36. Each disposable spacer 36 laterally surrounds a vertical stack of a semiconductor fin 30 and a fin cap structure 32.

Figure 8A:
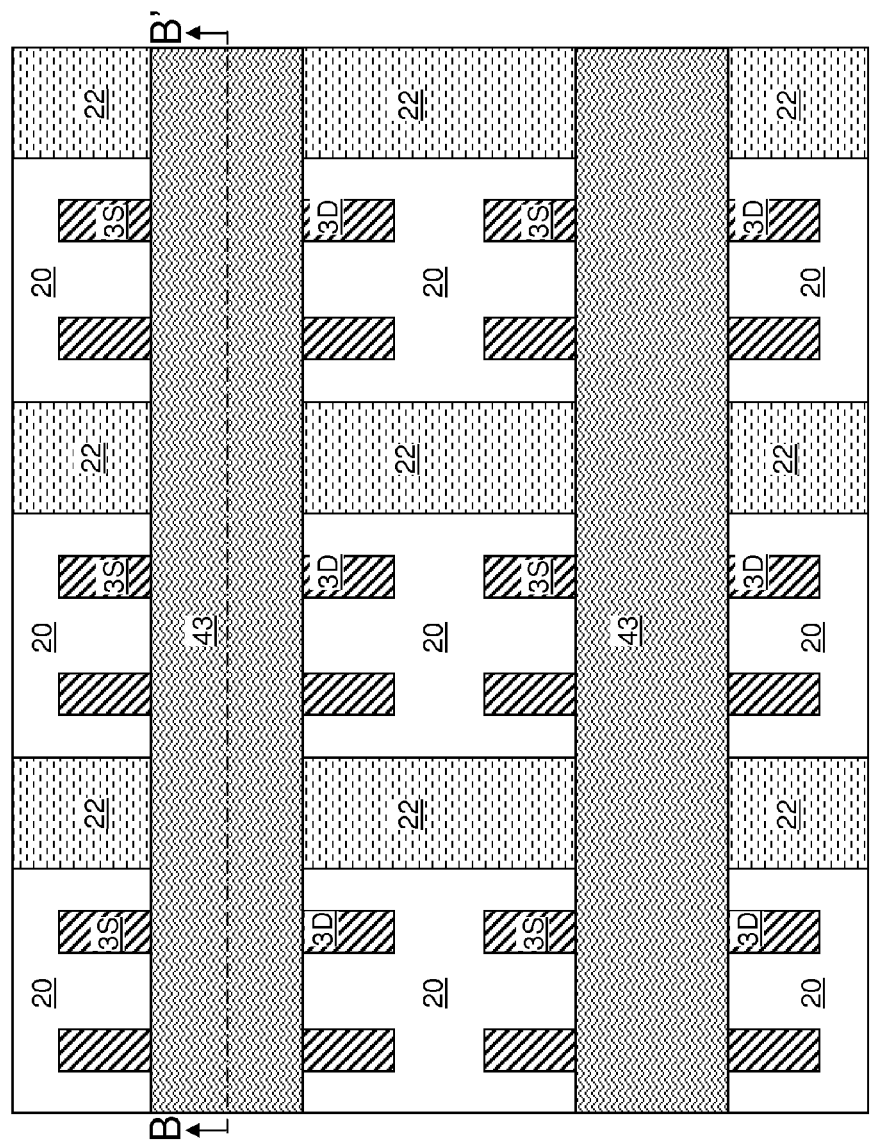
FIG. 8A is a top-down view of the first exemplary semiconductor structure after formation of a disposable gate structure and formation of source regions and drain regions according to the first embodiment of the present disclosure.
Figure 8B:
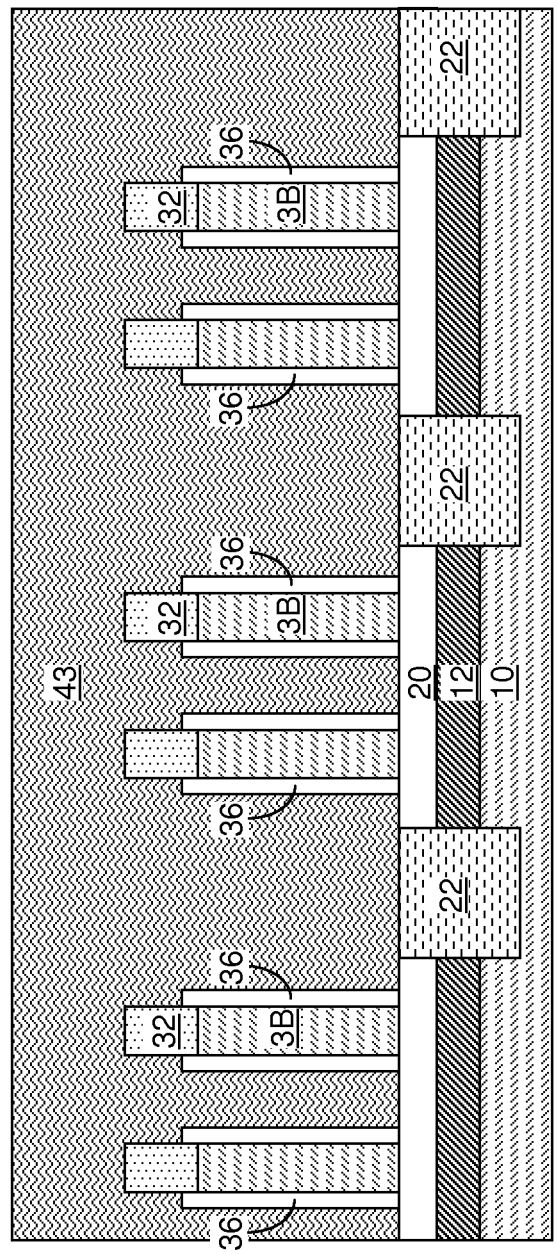
FIG. 8B is a vertical cross-sectional view of the first exemplary semiconductor structure along the vertical plane B-B' of FIG. 8A.

Referring to FIGS. 8A and 8B, a disposable gate structure 43 is formed across each row of semiconductor fins 30 (See FIGS. 7A and 7B). The disposable gate structures 43 can be formed, for example, by deposition of a disposable gate material layer, application and patterning of a photoresist layer over the disposable gate material layer, and transfer of the pattern in the photoresist layer through the disposable gate material layer by an anisotropic etch. Physically exposed portions of the disposable spacers 36 can be subsequently removed by an etch, which can be an isotropic etch. Each remaining portion of the disposable spacer 36 underlies a disposable gate structure 43, and can have a same length as the overlying disposable gate structure 43 along the lengthwise direction of the semiconductor fins 30. The photoresist layer can be removed, for example, by ashing.

The disposable gate structures 43 can include a semiconductor material, a dielectric material, or a conductive material, provided that the material of the mandrel structures 31 is different from the materials of the fin cap structures 32, the disposable spacers 36, and the back gate dielectrics 20. In one embodiment, the disposable gate structures 43 can include a silicon-germanium alloy, germanium, amorphous carbon, silicon oxynitride, organosilicate glass (OSG), a dielectric metal oxide, a dielectric metal nitride, an organic material, an elemental metal, an intermetallic alloy, a metal oxide, a metal nitride, or any other material different from the materials of the fin cap structures 32, the disposable spacers 36, and the back gate dielectrics 20. Optionally, the top surface of the disposable gate material layer can be planarized prior to patterning into the disposable gate structures 43. The top surface of the disposable gate structures 43 is located above the horizontal plane including the top surfaces of the fin cap structures 32.

Ion implantation can be performed to doped portions of the semiconductor fins 30 that are not masked by the disposable gate structures 46. A source region 3S and a drain region 3D can be formed in each semiconductor fin 30. Each source region 3S is formed on one unmasked side of a semiconductor fin 30 with respect to a disposable gate structure 43, and each drain region 3D is formed on another unmasked side of the semiconductor fin 30 with respect to the disposable gate structure 43. The unimplanted portion of the semiconductor fin 30 between a source region 3S and a drain region 3D is a body region 3B. Each semiconductor fin (3S, 3D, 3B) includes a source region 3S, a drain region 3D, and a body region 3B. Each disposable gate structure 43 straddles a plurality of semiconductor fins 30 located in the same row of the array of semiconductor fins (3S, 3D, 3B).

Referring to FIGS. 9A and 9B, a planarization dielectric layer 40 is formed by depositing a dielectric material over the source and drain regions (3S, 3D) of the semiconductor fins (3S, 3D, 3B), the back gate dielectrics 20, and the disposable gate structures 43, and planarizing the deposited dielectric material employing the top surfaces of the disposable gate structures 43 as stopping surfaces. Dielectric materials that can be employed for the planarization dielectric layer 40 include, but are not limited to, doped silicate glass, undoped silicate glass, organosilicate glass, silicon nitride, a dielectric metal oxide, a dielectric metal nitride, or a combination thereof. The dielectric material of the planarization dielectric layer 40 can be deposited by chemical vapor deposition, atomic layer deposition, and/or spin coating. The planarization of the deposited dielectric material can be performed by chemical mechanical planarization (CMP). The top surfaces of the planarization dielectric layer 40 can be coplanar with the top surfaces of the disposable gate structures 43.

Referring to FIGS. 10A and 10B, the disposable gate structures 43 are removed selective to the planarization dielectric layer 40, the disposable spacers 36, and the back gate dielectrics 20 by an etch. The etch can be an anisotropic etch or an isotropic etch. A gate cavity 59 is formed in each volume from which a disposable gate structure 43 is removed. Each gate cavity 59 extends along the widthwise direction of the semiconductor fins 30, and overlies a plurality of body regions 3B of semiconductor fins (3S, 3D, 3B) located within the same row in the array of semiconductor fins (3S, 3D, 3B).

Referring to FIGS. 11A and 11B, a second patterned mask layer 49 is formed above each shallow trench isolation structure 22. The second patterned mask layer 49 can be a patterned photoresist layer. The second patterned mask layer 49 can cover all areas of the shallow trench isolation structures 22. Further, the second patterned mask layer 49 can overlie all distal sidewalls of each pair of semiconductor fins (3S, 3D, 3B) located over a same back gate electrode 12 and laterally spaced from each other along the widthwise direction of the semiconductor fins (3S, 3D, 3B). As used herein, for each parallel pair of semiconductor fins that are laterally spaced from each other along a widthwise direction of the semiconductor fins, distal sidewalls of the pair of semiconductor fins refers to two outer lengthwise sidewalls of the pair of semiconductor fins. As used herein, for each parallel pair of semiconductor fins that are laterally spaced from each other along a widthwise direction of the semiconductor fins, proximal sidewalls of the pair of semiconductor fins refers to two inner lengthwise sidewalls of the pair of semiconductor fins. Thus, for each pair of semiconductor fins (3S, 3D, 3B) located over a same back gate electrode 12 and laterally spaced from each other along the widthwise direction of the semiconductor fins (3S, 3D, 3B), the second patterned mask layer 49 does not overlie the proximal sidewalls of the pair of semiconductor fins (3S, 3D, 3B).

An anisotropic etch is performed to remove physically exposed portions of the back gate dielectrics 20 from within the areas of the openings in the second patterned mask layer 49. The combination of the second patterned mask layer 49, the planarization dielectric layer 40, the disposable spacers 36, the fin cap structures 32 function as an etch mask. An opening in a back gate dielectric 20 is formed between each pair of semiconductor fins (3S, 3D, 3B) located over a same back gate electrode 12 and laterally spaced from each other along the widthwise direction of the semiconductor fins (3S, 3D, 3B). If N pairs of semiconductor fins (3S, 3D, 3B) are present over a single back gate electrode 12, N disjoined openings can be formed in the back gate dielectric 20 overlying the back gate electrode 12. The sidewalls of the openings in the back gate dielectrics 20 can vertically coincide with outer sidewalls of the disposable spacers 36 and sidewalls of the planarization dielectric layer 40. A top surface of a back gate electrode 12 is physically exposed underneath each opening in the back gate dielectrics 20. If N pairs of semiconductor fins (3S, 3D, 3B) are present over a single back gate electrode 12, N disjoined portions of the top surface of the back gate electrode 12 can be physically exposed after the anisotropic etch. The second patterned mask layer 49 can be subsequently removed, for example, by ashing.

Referring to FIGS. 12A and 12B, the disposable spacers 36 are removed selective to the semiconductor fins (3S, 3D, 3B) by an etch, which can be an isotropic etch. In one embodiment, the disposable spacers 36 can be removed by a wet etch. In an illustrative example, if the disposable spacers 36 include silicon nitride, the disposable spacers 36 can be removed by a wet etch employing hot phosphoric acid. Depending on selection of the materials for the disposable spacers 36 and the fin cap structures 32, and portions of the fin cap structures 32 may, or may not, be collaterally etched.

Referring to FIGS. 13A and 13B, a tunneling gate dielectric layer 50L is formed on the on all sidewalls of the semiconductor fins (3S, 3D, 3B) including the proximal sidewalls and distal sidewalls of the semiconductor fins (3S, 3D, 3B). The tunneling gate dielectric layer 50L can include any dielectric material that can be employed as a tunneling gate dielectric known in the art. In one embodiment, the tunneling gate dielectric layer 50L can include a deposited dielectric material. In this case, the tunneling gate dielectric layer 50L can be formed on the sidewalls top surfaces of the fin cap structures 32, the top surfaces of the shallow trench isolation structures 22, the physically exposed portions of top surfaces and sidewalls of the buried gate dielectrics 20, and on the top surfaces of physically exposed portions of the buried gate electrodes 12. In another embodiment, the back gate electrodes 12 can include a semiconductor material, and the tunneling gate dielectric layer 50L can include multiple disjoined portions of dielectric materials formed by conversion of surface portions of the semiconductor fins 30 and physically exposed surface portions of buried gate electrodes 12 into dielectric material portions by thermal conversion and/or plasma conversion. For example, the tunneling gate dielectric layer 50L can include silicon oxide, silicon nitride, silicon oxynitride, or a stack thereof. The thickness of the tunneling gate dielectric layer 50L can be in a range from 1.0 nm to 3.0 nm, although lesser and greater thicknesses can also be employed.

Subsequently, a floating gate material layer 52L is deposited on the tunneling gate dielectric layer 50L. The floating gate material layer 52L includes a conductive material, which can be a doped semiconductor material or a metallic material. In one embodiment, the floating gate material layer 52L can include doped polysilicon, a doped silicon-germanium alloy, or a doped silicon-carbon alloy. In another embodiment, the floating gate material layer 52L can include a metallic nitride or a metallic carbide. The floating gate material layer 52L can be deposited by a conformal or non-conformal deposition method. For example, the floating gate material layer 52L can be deposited by chemical vapor deposition (CVD), physical vapor deposition (PVD), atomic layer deposition (ALD), or a combination thereof.

In one embodiment, the floating gate material layer 52L can be deposited by a conformal deposition method such as low pressure chemical vapor deposition (LPCVD) or atomic layer deposition (ALD). In this case, horizontal portions and vertical portions of the floating gate material layer 52L can have the same thickness. The thickness of the floating gate material layer 52L can be in a range from 3 nm to 100 nm, although lesser and greater thicknesses can also be employed. The space between each neighboring pair of semiconductor fins (3S, 3D, 3B) that is located on a same back gate electrode 12 is completely filled with the floating gate material layer 52L, while the a recessed region including outer sidewalls of the floating gate layer 52L is formed within remaining portions of the gate cavities 59 that overlie the shallow trench isolation structures 22.

Referring to FIGS. 14A and 14B, the floating gate material layer 52L is isotropically etched back by an isotropic etch. The material of the floating gate layer 52L is isotropically etched from each outer sidewall of the floating gate layer 52L in recessed regions within portions of the gate cavity 59 overlying the shallow trench isolation structures 22. Further, portions of the floating gate material layer 52L overlying the planarization dielectric layer 40 are removed during the isotropic etch.

A remaining portion of the floating gate material layer 52L is present between each neighboring pair of semiconductor fins (3S, 3D, 3B) that overlie a same back gate electrode 12 and laterally spaced from each other along the widthwise direction of the semiconductor fins (3S, 3D, 3B). Each remaining portion of the floating gate material layer 52L constitutes a floating gate electrode 52.

Physically exposed portions of the floating gate dielectric layer 50L can be removed, for example, by an isotropic etch. For example, if the floating gate dielectric layer 50L includes silicon oxide, a wet etch employing hydrofluoric acid can be employed to remove physically exposed portions of the floating gate dielectric layer 50L. Each remaining portion of the floating gate dielectric layer 50L constitutes a floating gate dielectric 50. In one embodiment, each floating gate dielectric 50 can be contiguous from a proximal sidewall of a first semiconductor fin within a pair of semiconductor fins (3S, 3D, 3B) through a top surface of an underlying back gate electrode 12 to a proximal sidewall of a second semiconductor fin within the pair of semiconductor fins (3S, 3D, 3B). A floating gate electrode 52 is formed between the pair of semiconductor fins (3S, 3D, 3B) and on the sidewalls and top surfaces of the tunneling gate dielectric 50.

An underlying back gate dielectric 20 is located in the substrate (10, 12, 20), and contacts the pair of semiconductor fins (3S, 3D, 3B). The back gate electrode 12 is located in the substrate (10, 12, 20) and underlies the back gate dielectric 20. Each tunneling gate dielectric 50 can be in contact with a bottom surface of the floating gate electrode 52. Each back gate dielectric 20 can be is in physical contact with sidewalls of the tunneling gate dielectric 50.

Referring to FIGS. 15A and 15B, a control gate dielectric layer including a dielectric material and a conductive material layer are sequentially deposited on the floating gate electrodes 52 and distal sidewalls of the semiconductor fins (3S, 3D, 3B). The control gate dielectric layer can include any material for a gate dielectric as known in the art.

In one embodiment, the control gate dielectric layer can include a deposited dielectric material. In this case, the control gate dielectric layer can be formed as a single contiguous layer on sidewalls and top surfaces of the fin cap structures 32, top surfaces of the shallow trench isolation structures 22, and physically exposed portions of top surfaces of the buried gate dielectrics 20. In another embodiment, the floating gate electrodes 52 can include a semiconductor material, and the control gate dielectric layer can include multiple disjoined portions of dielectric materials formed by conversion of surface portions of the distal sidewalls of the semiconductor fins 30 and top surface portions of floating gate electrodes 52 into dielectric material portions by thermal conversion and/or plasma conversion. For example, the control gate dielectric layer can include silicon oxide, silicon nitride, silicon oxynitride, or a stack thereof. The thickness of the control gate dielectric layer 50L can be in a range from 2.0 nm to 10 nm, although lesser and greater thicknesses can also be employed.

The conductive material layer can include any conductive material that is suitable for a gate electrode as known in the art. The conductive material layer can include a doped semiconductor material and/or a metallic material.

The control gate dielectric layer and the conductive material layer can completely fill the gate cavities 59 (See FIGS. 14A and 14B). Excess portions of the control gate dielectric layer and the conductive material layer can be removed from above the top surface of the planarization dielectric layer 40 by a planarization process, which can employ a recess etch and/or chemical mechanical planarization. Each remaining portion of the conductive material layer constitutes a control gate electrode 62. Each remaining portion of the control gate dielectric layer constitutes a control gate dielectric 60.

In one embodiment, each control gate dielectric 60 for a pair of semiconductor fins (3S, 3D, 3B) can be a single contiguous dielectric layer contacting two distal sidewalls of the pair of semiconductor fins (3S, 3D, 3B), a top surface of a floating gate electrode 52, and surfaces of two fin cap structures 32. In this case, a control gate dielectric 60 can contact multiple pairs of semiconductor fins (3S, 3D, 3B) located within the same row of the two-dimensional array of semiconductor fins (3S, 3D, 3B) and underlying the same control gate electrode 62. Alternatively, if the control gate dielectric layer is formed as multiple disjoined portions by conversion of surface portions of semiconductor materials into dielectric material portions, a control gate dielectric 60 for a pair of semiconductor fins (3S<3D, 3B) can be three disjoined dielectric material portions that do not contact one another and contacting only one surface selected from the two distal sidewalls of the pair of semiconductor fins (3S, 3D, 3B) and the top surface of the floating gate dielectric 52.

The first exemplary semiconductor structure includes at least a pair of semiconductor fins (3S, 3D, 3B) located on a substrate (10, 12, 20), a tunneling gate dielectric 50 located on proximal sidewalls of the pair of semiconductor fins 3B, a floating gate electrode 52 located between the pair of semiconductor fins (3S, 3D, 3B) and contacting the tunneling gate dielectric 50, a control gate dielectric 60 contacting distal sidewalls of the pair of semiconductor fins (3S, 3D, 3B) and a top surface of the floating gate electrode 52, and a control gate electrode 62 overlying the control gate dielectric 60. In one embodiment, outer sidewalls of the floating gate dielectric 50 that do not contact the pair of semiconductor fins (3S, 3D, 3B) can be vertically coincident with outer sidewalls of the control gate dielectric 60. Each of the pair of semiconductor fins (3S, 3D, 3B) can include a body 3B region underlying the control gate electrode 62, a source region 3S including a portion that does not underlie the control gate electrode 62, and a drain region including a portion that does not underlie the control gate electrode 62 and laterally spaced from the source region 3S by the body region 3B.

Referring to FIGS. 16A and 16B, FIG. 16A a contact level dielectric layer 90 including a dielectric material can be formed over the planarization dielectric layer 90 and the control gate electrode 62. The dielectric material of the contact level dielectric layer 90 can be silicon oxide, silicon nitride, organosilicate glass, and/or any other material known as interlayer dielectric material for metal interconnect structures.

Various contact via structures (8S, 8D) can be formed through the contact level dielectric layer 90. The various contact via structures (8S, 8D) can include, for example, source contact via structures 8S and drain contact via structures 8D, which can contact source regions 3S and the drain regions 3D, respectively. Metal line structures (9S, 9D) can be formed on the top surfaces of the contact via structures (8S, 8D) on, or above, the contact level dielectric layer employing methods known in the art.

A set of components including a pair of semiconductor fins (3S, 3D, 3B), a floating gate dielectric 50 (See FIG. 15B), a floating gate electrode 52, a back gate electrode 12 underlying the pair of semiconductor fins, a control gate dielectric 60 that contact the pair of semiconductor fins (3S, 3D, 3B) and the floating gate dielectric 50, and a control gate electrode 62 collectively constitute a flash memory device. During the operation of the flash memory device, the characteristics of the two transistors sharing a common floating gate electrode 52 and a common control gate electrode 62 are affected by the amount of electrical charges stored in the floating gate electrode 52.

Access of the flash memory device can be facilitated by wiring the source regions 3S and the drain regions 3D within the same row of the two-dimensional array of semiconductor fins (3S, 3D, 3B) with common access line structures. Specifically, all source regions 3S of the pair of semiconductor fins (3S, 3D, 3D) and other pairs of semiconductor fins (3S, 3D, 3B) located within the same row of the two-dimensional array of semiconductor fins (3S, 3D, 3B) and overlying different back gate electrodes 12 can be electrically shorted through a set of source contact via structures 8S and a source metal line structure 9S. Likewise, all drain regions 3D of the pair of semiconductor fins (3S, 3D, 3D) and other pairs of semiconductor fins (3S, 3D, 3B) located within the same row of the two-dimensional array of semiconductor fins (3S, 3D, 3B) and overlying different back gate electrodes 12 can be electrically shorted through a set of drain contact via structures 8S and a drain metal line structure 9S.

Referring to FIGS. 17A and 17B, a variation of the first exemplary semiconductor structure is shown, in which the floating gate dielectrics 50 are formed by conversion of surface portions of the semiconductor materials of the semiconductor fins (3S, 3D, 3B) and the back gate electrodes 12. Specifically, surface portions of the proximal sidewalls of each semiconductor fin (3S, 3D, 3B) and physically exposed surface portions of the back gate electrodes 12 are converted into dielectric semiconductor oxide/oxynitride/nitride portions by thermal and/or plasma conversion. Further, the control gate dielectrics 60 can be formed by conversion of surface portions of the semiconductor material of the semiconductor fins (3S, 3D, 3B) and the floating gate electrode 52. Specifically, surface portions of the distal sidewalls of each semiconductor fin (3S, 3D, 3B) and physically exposed surface portions of the floating gate electrodes 52 are converted into dielectric semiconductor oxide/oxynitride/nitride portions by thermal and/or plasma conversion.

Referring to FIGS. 18A and 18B, a second exemplary semiconductor structure according to a second embodiment of the present disclosure can be derived from the first exemplary semiconductor structure of FIGS. 3A and 3B by every third column of stacks of a semiconductor fin 30 and a fin cap structure 32. Removal of every third column in the two-dimensional array of stacks of a semiconductor fin 30 and a fin cap structure 32 can be effected by applying and patterning a photoresist layer (not shown) to form openings in regions overlying every third column of the two-dimensional array, and by removing physically exposed portions of the two-dimensional array of a semiconductor fin 30 and a fin cap structure 32. The photoresist layer is subsequently removed, for example, by ashing.

Referring to FIGS. 19A and 19B, disposable dielectric spacers 33 can be formed by conformal deposition of a dielectric material and an anisotropic etch. The thickness of the deposited conformal dielectric material layer is selected to be greater than one half of the spacing s between a neighboring pair of semiconductor fins 30, and is less than the sum of the spacing s and one half of the width w of a semiconductor fin 30. A volume between a pair of semiconductor fins 30 spaced by the spacing s is filled with a disposable dielectric spacer 33, and a cavity is present between two disposable dielectric spacers 33 in regions from which the semiconductor fins are removed in the processing steps of FIGS. 18A and 18B. Dielectric materials that can be employed for the disposable dielectric spacers 33 include, but are not limited to, silicon nitride, organosilicate glass, and a dielectric metal oxide. In one embodiment, the disposable dielectric spacers 33 can include silicon nitride. Each dielectric spacer 33 can include multiple pairs of semiconductor fins 30 that are located within two neighboring columns within the two-dimensional array of stacks of a semiconductor fin 30 and a fin cap structure 32.

Referring to FIGS. 20A and 20B, shallow trenches are formed within the substrate (10, 12L, 20L; See FIGS. 19A and 19B) employing the combination of the fin cap structures 32 and the disposable dielectric spacers 33 as an etch mask. The shallow trenches can extend through the back gate dielectric layer 20L and the back gate conductor layer 12L and into a top portion of the handle substrate layer 10.

Shallow trench isolation structures 22 can be formed by depositing a dielectric material in the shallow trenches, planarizing the deposited dielectric material, and optionally recessing the dielectric material. The dielectric material of the shallow trench isolation structures 22 can be deposited by a self-planarizing deposition method such as spin-coating. Alternatively, the dielectric material of the shallow trench isolation structures 22 can be deposited by a non-self-planarizing deposition method such as chemical vapor deposition, planarized employing the top surfaces of the fin cap structures 32 as stopping surfaces, and subsequently recessed. The dielectric material that can be employed for the shallow trench isolation structures 22 can be, for example, doped silicate glass (such as borosilicate glass, borophosphosilicate glass, and fluorosilicate glass), organosilicate glass (OSG), silicon oxynitride, and/or a dielectric metal oxide. The top surfaces of the shallow trench isolation structures can be coplanar with, raised above, or recessed below, the top surfaces of the back gate dielectrics 20.

Each remaining portion of the back gate dielectric layer 20L between a neighboring pair of shallow trench isolation structures 22 constitutes a back gate dielectric 20. Each remaining portion of the back gate conductor layer 12L between a neighboring pair of shallow trench isolation structures 22 constitutes a back gate electrode 12. A vertical stack including a back gate dielectric 20 and a back gate electrode 12 is formed in the substrate (10, 12, 20) and underneath pairs of semiconductor fins 30 that are located within a pair of neighboring columns of semiconductor fins 30. Each vertical stack of a back gate dielectric 20 and a back gate electrode 12 can contiguously extend underneath N pairs of semiconductor fins 30, in which N is an integer greater than 1. The N pairs of semiconductor fins 30 between a neighboring pair of shallow trenches 21 can be located within the area defined by the periphery of the back gate electrode 12 underlying the N pairs of semiconductor fins 30.

In one embodiment, sidewalls of each back gate electrode 12 and each back gate dielectric 20 can contact sidewalls of the shallow trench isolation structures 22. Each neighboring pair of back gate electrodes 12 is electrically isolation from each other by a shallow trench isolation structure 22 therebetween.

Each shallow trench isolation structure 22 includes a dielectric material, is embedded in the substrate (10, 12, 20), and laterally extends along the lengthwise direction of the semiconductor fins 30. A sidewall of each back gate dielectric 20 and a sidewall of each back gate electrode can contact a sidewall of a shallow trench isolation structure 22. In one embodiment, the sidewalls of a back gate dielectric 20 and a sidewall of an underlying back gate electrode 12 can be vertically coincident with each other. As used herein, a first surface and a second surface are vertically coincident with each other if the first and second surfaces are within a same vertical plane.

While the present disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the present disclosure is intended to encompass all such alternatives, modifications and variations which fall within the scope and spirit of the present disclosure and the following claims.

What is claimed is:

1. A method of forming a semiconductor structure comprising:
   forming a pair of semiconductor fins on a substrate;
   forming a tunneling gate dielectric on proximal sidewalls of said pair of semiconductor fins;
   forming a floating gate electrode between said pair of semiconductor fins on sidewalls of said tunneling gate dielectric;
   forming a control gate dielectric on distal sidewalls of said pair of semiconductor fins and a top surface of said floating gate electrode;
   forming a control gate electrode over said control gate dielectric;
   forming a vertical stack including a back gate dielectric and a back gate electrode in said substrate and underneath said pair of semiconductor fins; and
   forming a shallow trench isolation structure in said substrate, wherein sidewalls of said back gate electrode and said back gate dielectric contact sidewalls of said shallow trench isolation structure.

2. The method of claim 1, further comprising:
   forming a dielectric spacer laterally surrounding said pair of semiconductor fins and filling a space between said pair of semiconductor fins;
   forming a trench in said substrate employing said dielectric spacer as an etch mask; and
   forming said shallow trench isolation structure by filling said trench with a dielectric material.

3. The method of claim 2, further comprising removing said dielectric spacer after the forming said shallow trench isolation structure.

4. The method of claim 1, further comprising:
   forming another semiconductor fin on said substrate;
   removing said another semiconductor fin by an etch process, while said pair of semiconductor fins are protected from said etch process by a patterned mask layer, wherein a line cavity is formed in a volume from which said another semiconductor fin is removed;
   etching a portion of said substrate underlying said line cavity; and
   forming said shallow trench isolation structure by filling said trench with a dielectric material.

5. The method of claim 1, further comprising forming at least another pair of semiconductor fins on said substrate, wherein a vertical stack including said back gate dielectric and said back gate electrode contiguously extend underneath each of said at least another pair of semiconductor fins.

6. The method of claim 1, further comprising:
   forming another pair of semiconductor fins on said substrate;
   forming another back gate electrode underneath said another pair of semiconductor fins, wherein said shallow trench isolation structure electrically isolates said another back gate electrode from said back gate electrode;
   forming a body region, a source region, and a drain region in each semiconductor fin of said pair of semiconductor fins and said another pair of semiconductor fins; and
   electrically shorting all source regions of said pair of semiconductor fins and said another pair of semiconductor fins, and electrically shorting all drain regions of said pair of semiconductor fins and said another pair of semiconductor fins.

7. The method of claim 1, further comprising:
   forming disposable spacers on sidewalls including said proximal sidewalls and said distal sidewalls of said pair of semiconductor fins;
   forming a patterned mask layer overlying said distal sidewalls of said pair of semiconductor fins, while exposing said proximal sidewalls of said pair of semiconductor fins;
   removing a portion of said back gate dielectric that is not covered by said patterned mask layer, said disposable spacers and said pair of semiconductor fins to provide an opening in said back gate dielectric, wherein said opening exposes a top surface of said back gate electrode and sidewalls of said back gate dielectric; and
   removing said disposable spacers.

8. The method of claim 7, further comprising:
   forming a tunneling gate dielectric layer on top surfaces, said proximal sidewalls and said distal sidewalls of said pair of semiconductor fins, top surfaces and said sidewalls of said back gate dielectric, and said top surface of said back gate electrode;
   depositing a floating gate material layer on said tunneling gate dielectric layer;
   isotropically etching said floating gate material layer, wherein a remaining portion of said floating gate material layer is present between said pair of semiconductor fins to form said floating gate electrode; and
   removing portions of the tunneling gate dielectric layer that are not covered by said floating gate electrode, wherein a remaining portion of said tunneling gate dielectric layer is present on said proximal sidewalls of said pair of semiconductor fins and said top surface of said back gate electrode to form said tunneling gate dielectric.

9. The method of claim 1, further comprising converting surface portions of said proximal sidewalls of said pair of semiconductor fins and said back gate electrode into first dielectric portions to provide said tunneling gate dielectric.

10. The method of claim 9, further comprising:
depositing a floating gate material layer on said tunneling gate dielectric; and
isotropically etching said floating gate material layer, wherein a remaining portion of said floating gate material layer is present between said pair of semiconductor fins to form said floating gate electrode.

11. The method of claim 10, further comprising:
forming a disposable gate structure straddling said pair of semiconductor fins;
forming a source region and a drain region in each semiconductor fin of said pair of semiconductor fins; and
removing said disposable gate structure prior to forming said tunneling gate dielectric.

12. The method of claim 11, further comprising forming a planarization dielectric layer over said source region and said drain region of each semiconductor fin of said pair of semiconductor fins prior to the removing said disposable gate structure.

13. The method of claim 10, further comprising converting surface portions of said distal sidewalls of said pair of semiconductor fins and said floating gate electrode into second dielectric portions to provide said control gate dielectric.

14. The method of claim 13, wherein each of said converting said surface portions of said proximal sidewalls of said pair of semiconductor fins and said back gate electrode and said converting said surface portions of said distal sidewalls of said pair of semiconductor fins and said floating gate electrode is performed by a thermal conversion, a plasma conversion, or a combination thereof.

15. The method of claim 1, further comprising forming a fin cap atop each semiconductor fin of said pair of semiconductor fins, wherein said control gate dielectric contacts sidewalls and a top surface of said fin cap.

16. The method of claim 1, wherein said forming said pair of semiconductor fins comprises:
forming a mandrel structure over a top semiconductor layer located over said substrate;
forming spacer structures on sidewalls of said mandrel structure;
removing said mandrel structure; and
patterning the top semiconductor layer using said spacer structures as an etch mask.

17. A method of forming a semiconductor structure comprising:
forming a pair of semiconductor fins on a substrate;
forming a vertical stack including a back gate dielectric and a back gate electrode in said substrate and underneath said pair of semiconductor fins;
forming disposable spacers on sidewalls including proximal sidewalls and distal sidewalls of said pair of semiconductor fins;
forming a patterned mask layer overlying said distal sidewalls of said pair of semiconductor fins, while exposing said proximal sidewalls of said pair of semiconductor fins;
removing a portion of said back gate dielectric that is not covered by said patterned mask layer, said disposable spacers and said pair of semiconductor fins to provide an opening in said back gate dielectric, wherein said opening exposes a top surface of said back gate electrode and sidewalls of said back gate dielectric;
removing said disposable spacers;
forming a tunneling gate dielectric on said proximal sidewalls of said pair of semiconductor fins;
forming a floating gate electrode between said pair of semiconductor fins on sidewalls of said tunneling gate dielectric;
forming a control gate dielectric on said distal sidewalls of said pair of semiconductor fins and a top surface of said floating gate electrode; and
forming a control gate electrode over said control gate dielectric.

18. A method of forming a semiconductor structure comprising:
forming a pair of semiconductor fins on a substrate;
forming a vertical stack including a back gate dielectric and a back gate electrode in said substrate and underneath said pair of semiconductor fins;
forming a tunneling gate dielectric on proximal sidewalls of said pair of semiconductor fins by converting surface portions of said proximal sidewalls of said pair of semiconductor fins and said back gate electrode into first dielectric portions;
forming a floating gate electrode between said pair of semiconductor fins on sidewalls of said tunneling gate dielectric;
forming a control gate dielectric on distal sidewalls of said pair of semiconductor fins and a top surface of said floating gate electrode; and
forming a control gate electrode over said control gate dielectric.

* * * * *